United States Patent [19]
Nakagomi et al.

[11] Patent Number: 5,742,173
[45] Date of Patent: Apr. 21, 1998

[54] METHOD AND APPARATUS FOR PROBE TESTING SUBSTRATE

[75] Inventors: Yoichi Nakagomi, Yamanashi-ken; Hidehito Yokomori, Nirasaki; Shinji Iino, Yamanashi-ken; Satoshi Sano, Yamanashi, all of Japan

[73] Assignee: Tokyo Electron Limited, Tokyo, Japan

[21] Appl. No.: 737,338

[22] PCT Filed: Mar. 18, 1996

[86] PCT No.: PCT/JP96/00699

§ 371 Date: Nov. 18, 1996

§ 102(e) Date: Nov. 18, 1996

[87] PCT Pub. No.: WO96/29607

PCT Pub. Date: Sep. 26, 1996

[30] Foreign Application Priority Data

| Mar. 18, 1995 | [JP] | Japan | 7-086176 |
| Mar. 18, 1995 | [JP] | Japan | 7-086177 |
| Mar. 27, 1995 | [JP] | Japan | 7-091766 |
| Mar. 31, 1995 | [JP] | Japan | 7-100019 |

[51] Int. Cl.⁶ ........................ G01R 1/04
[52] U.S. Cl. ........................ 324/753
[58] Field of Search ........ 73/865.8; 324/758, 324/761; 348/87, 94, 95, 92

[56] References Cited

U.S. PATENT DOCUMENTS

| 4,131,267 | 12/1978 | Ono et al. | |
| 5,091,692 | 2/1992 | Ohno et al. | 324/758 |
| 5,479,108 | 12/1995 | Cheng | 324/765 |

*Primary Examiner*—Robert Raevis
*Attorney, Agent, or Firm*—Oblon, Spivak, McClelland, Maier & Neustadt, P.C.

[57] ABSTRACT

A substrate inspecting method has a step of previously storing as initial setting data the positional information of a mounting table on which the substrate is placed and the positional information of the probe, a calibration step of moving a first alignment member provided at a position away by a specified distance from the mounting table together with the mounting table, and aligning the first alignment member with a second alignment member fixed to a position away by a specified distance from the probe, a step of calculating a distance between the calibrated position and the mutual probe/pad contact position on the basis of the previously stored initial setting data, and moving the mounting table on the basis of the calculated results to position the pad at the probe, and a step of contacting the pad of the substrate on the mounting table with the probe, and sending a test signal to a pattern circuit on the substrate to inspect.

12 Claims, 15 Drawing Sheets

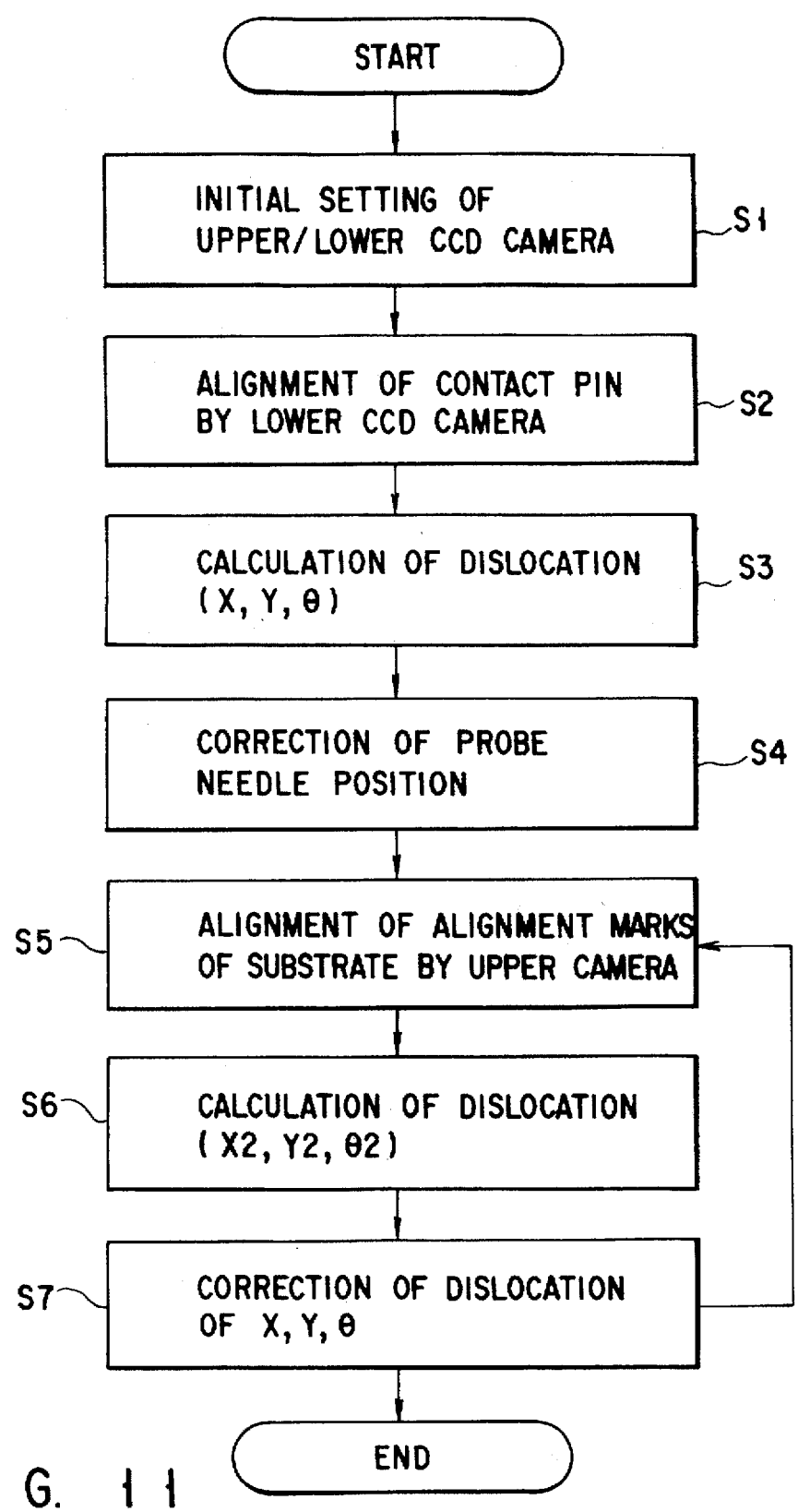
F I G. 11

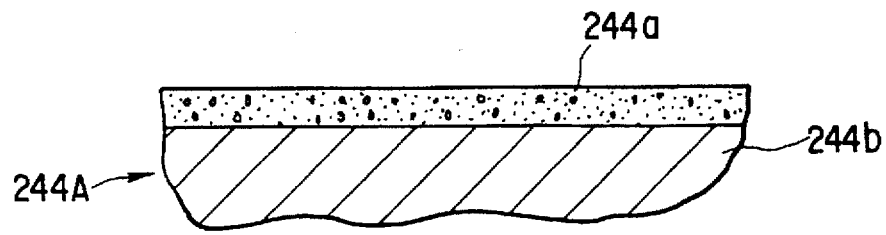
F I G. 15
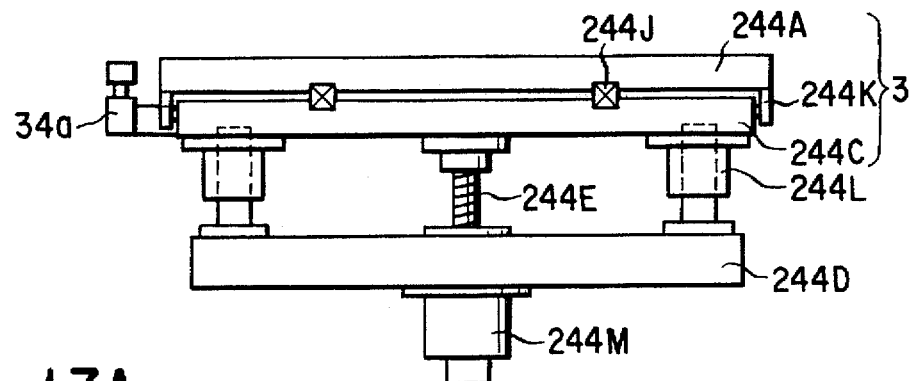
F I G. 17A
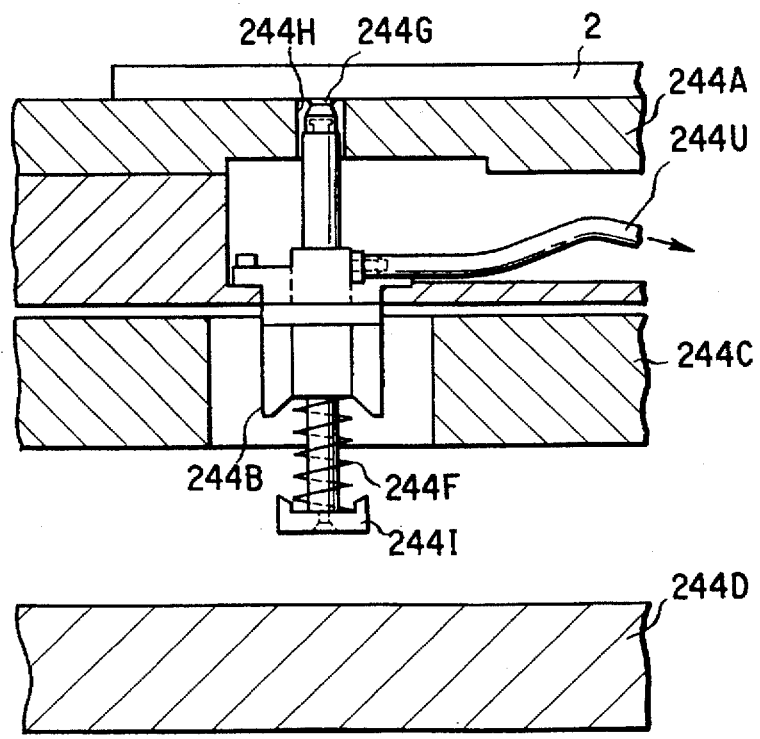
F I G. 17B

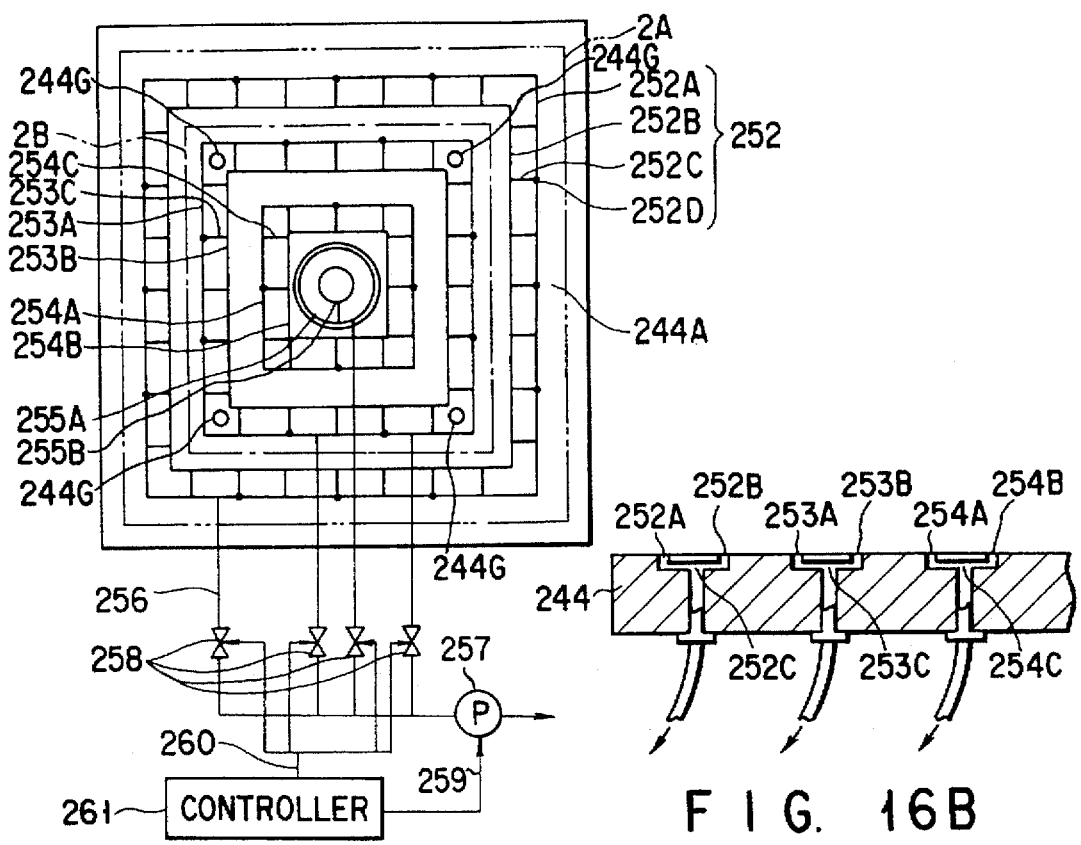
FIG. 16A
FIG. 16B
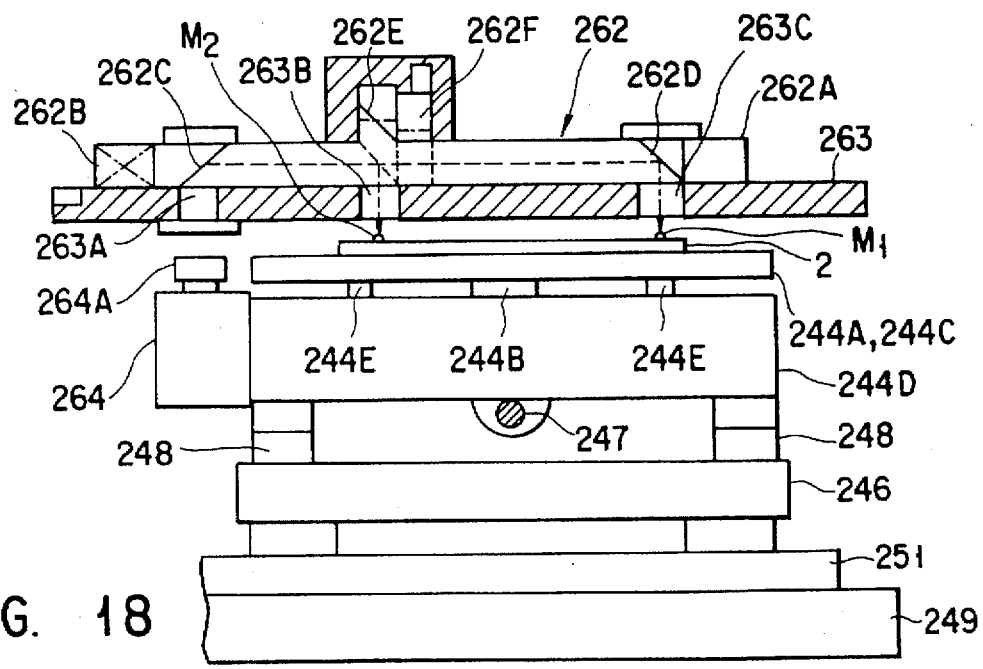
FIG. 18

METHOD AND APPARATUS FOR PROBE TESTING SUBSTRATE

TECHNICAL FIELD

The present invention relates to method for probe testing electrical characteristics of pattern circuits of substrate for liquid crystal display (LCD) or semiconductor wafer, and to apparatus for probe testing substrate.

A TFT (Thin-Film Transistor) LCD has an LCD substrate which comprises a glass substrate and electric circuits are provided for performing on-off control of pixels. The electric circuits have been formed by an apparatus such as a film forming apparatus. Pads are provided on the substrate, located near the respective electric circuits. They are used as electric contacts.

The LCD substrate is inspected to determine whether or not each electric circuit works as desired. The inspection cannot be started unless the LCD substrate is correctly positioned. To position the LCD substrate correctly, alignment marks, e.g., crosses, are provided on the corners of the substrate.

In an LCD prober, a substrate is aligned with a probe, and then a pad on the substrate is contacted with the tip portion of the probe to conduct, and a test signal is sent to the circuits to inspect electrical characteristics of the substrate.

A method of inspecting an LCD substrate is disclosed in Jpn. Pat. Appln. KOKOKU Publication No. 62-31825. In this method, an image of the entire substrate is obtained by a first TV camera, while an image of the probes is obtained by the second TV camera. Both images are displayed on the same monitor screen. The substrate is moved until the pads displayed on the screen are aligned with the probes displayed on the screen.

However, in such conventional inspecting method, when an inspection performed by abutting the probe against a pad P is repeated, particles can deposit on the tip portion of probe, thereby causing the tip portion of the probe not to be recognized. A profile contrast of the tip portion at picking up can be changed due to a dirt on the probe tip portion or an oxidation of the probe tip portion surface, thereby causing the to be hardly recognized. For this reason, an alignment accuracy of the probe is reduced, or a variation in alignment time occurs.

The probe testing apparatus generally is provided with a handling section for loading/unloading an LCD substrate with respect to a substrate mounting table, and an inspecting section for electrically inspecting the LCD substrate unloaded from the handling section. The handling section is configured such that it unloads one by one from, for example, twenty five LCD substrates housed in a cassette to perform handling. The handling section is provided with, for example, a cassette placing member for placing a cassette, and a transfer device for unloading one by one from LCD substrates in the cassette placed on the cassette placing member and transferring the substrate to the testing section. The inspecting section is provided with a substrate mounting table for holding the substrate unloaded from the transfer device of the handling section, an alignment mechanism for detecting alignment marks $M_1$, $M_2$ shown in FIG. 2 while illuminating the substrate placed on the substrate mounting table, and a probe means for performing electric inspection by being contacted with respective pads of the substrate after the alignment by the substrate mounting table driven on the basis of inspection results from the alignment mechanism.

The testing apparatus is provided with a CCD camera for picking up the alignment marks $M_1$, $M_2$ detected by the alignment mechanism, an image processing means for image processing a signal from the CCD camera, and a display device for receiving the signal after being image processed to display the alignment marks $M_1$, $M_2$ as images. The substrate mounting table has up/down pins on the inside of the placing face. The up/down pins are such that the pins, when protruding beyond the mount surface, receive the substrate and support it at points, and then retract from the placing face to allow the substrate to be landed softly on the mount surface. Formed on the surface of the mount surface are sucking grooves, so that the substrate is chucked under vacuum through the sucking grooves on the mount surface to fix.

However, for a conventional inspecting equipment, the substrate mounting table of the inspecting section is formed by a metal such as aluminum and has a luster on the surface, and the mount surface is larger in area than the LCD substrate, so that when the substrate is placed on the substrate mounting table, the outer periphery of the mount surface largely protrudes from the substrate to the outside. Therefore, at alignment, when the LCD substrate is illuminated, the illuminated light is all reflected at the portion protruded beyond the LCD substrate on the substrate mounting table, and the reflected light is incident upon the CCD camera and then image processed together with the alignment marks $M_1$, $M_2$, thereby causing a halation on the screen of the display device and the alignment marks $M_1$, $M_2$ to become blurry.

Although generally, an LCD substrate had been 370 mm in length, 470 mm in width and 1.1 mm in thickness in size, a recent LCD substrate has been larger and thinner than the former substrate, and for example, the size has become 550 mm in length, 650 mm in width and 0.7 mm in thickness. Therefore, in a conventional inspecting equipment, when a substrate is unloaded by the substrate mounting table of the specting section, the substrate is supported at points by a plurality of up/down pins on the substrate mounting table, so that the supporting state becomes unstable. When the up/down pins are lowered, the periphery of a substrate 2 is shaken upward/downward, so that the soft landing onto the mount surface becomes unstable.

In a conventional substrate mounting table, sucking grooves formed on the mount surface are formed uniformly from the outer periphery toward the inside, for example, in a manner to be spaced apart from each other by a specified distance, and in addition, an evacuation is performed through sucking holes and sucking passes provided in respective sucking groove. For this reason, respective sucking groove must be provided individually with sucking holes and sucking passes, whereby the number of sucking passes becomes large, and thus the vacuum chuck construction becomes complex.

When an LCD substrate is handled and transferred by a conventional equipment, the LCD substrate is largely deflected on an arm, whereby it becomes difficult to perform easily the loading/unloading of the LCD substrate on the cassette. That is, as shown in FIG. 1, an arm 1 of a conventional transfer device supports an LCD substrate 2 by only one place on a substantially central portion of the width thereof. For this reason, when the LCD substrate 2 is raised in a cassette C by the arm 1 to unload, a collision between the substrates occurs. That is, as shown in FIG. 21, both ends of a substrate 2a are largely deflected, so that before the substrate 2a is raised complete from support parts $C_1$, the central portion of the substrate 2a contacts with a substrate 2b supported by support parts $C_2$ just above the support parts $C_1$.

The cassette C and the substrate 2, before arriving at the inspecting equipment, may have static electricity. In the conventional inspecting equipment, if probe test is performed in such a charge up state, a discharge between the probe and the pad P will occur, whereby a pattern circuit on the substrate may be damaged. Particularly, the recent substrate 2 is apt to be charged up, and the circuit pattern is extremely and finely configured, so that the circuit pattern is apt to be damaged.

DISCLOSURE OF INVENTION

An object of the present invention is to provide an inspecting method capable of aligning a substrate to be inspected with a probe of an inspecting section at a high accuracy.

Another object of the present invention is to provide a substrate inspecting equipment capable of performing smoothly and reliably the sucking, holding and alignment of a substrate regardless of the size of the LCD substrate.

Still another object of the present invention is to provide a substrate inspecting equipment provided with a transfer device which is capable of smoothly loading/unloading a large and thin LCD substrate into/from a cassette, and which can hold stably and reliably the substrate to transfer.

Yet another object of the present invention is to provide a substrate inspecting equipment capable of inspecting a substrate without damaging a pattern circuit formed on the substrate even when the substrate and/or the cassette is in a charged up state.

A substrate inspecting method in connection with the present invention, in which a pad of a substrate is aligned with a probe, the pad is contacted with the probe, and a test signal is sent to a pattern circuit formed on the substrate to inspect, has a step of previously storing as initial setting data the positional information of a mounting table on which the substrate is placed and the positional information of the probe; a calibration step of moving a first alignment member provided at a position away by a specified distance from the mounting table together with the mounting table, and aligning the first alignment member with a second alignment member fixed to a position away by a specified distance from the probe; a step of calculating a distance between the calibrated position and the mutual probe/pad contact position on the basis of the previously stored initial setting data, and moving the mounting table on the basis of the calculated results to position the pad at the probe; and a step of contacting the pad of the substrate on the mounting table with the probe, and sending a test signal to a pattern circuit on the substrate to inspect.

A substrate inspecting equipment in connection with the present invention has a mounting table on which a substrate having many pads connected to a pattern circuit to be inspected is placed; an inspecting section provided with many probes contacted with respective pads of the substrate on the mounting table; an initial setting means for understanding the positional information of the mounting table on which the substrate is placed and the positional information of the probe, and previously storing these information as initial setting data; a first detection means for detecting the position of the probe of the above-mentioned inspecting section; a second detection means for detecting the position of the substrate on the above-mentioned mounting table; a calculation means for calculating the dislocation of the substrate on the above-mentioned mounting table on the basis of the position detected results obtained by the first and second detection means and the initial setting data called from the above-mentioned initial setting means; and a movement means for moving said mounting table to the above-mentioned inspecting section on the basis of the above-mentioned calculated dislocation to contact the pad of the substrate with the probe.

When a substrate is positioned, a reference object (a second alignment member) position for alignment provided near an inspecting section is detected; from the detected value, an abutting position of the inspecting section for abutting against a previously stored substrate is determined; and a mounting table on which the substrate has been placed is moved to the abutting position to effect positioning, so that the accuracy in the alignment of the substrate can be kept constant.

A substrate inspecting equipment in connection with the present invention is provided with a mounting table on which a substrate for liquid crystal display with alignment marks is placed; an inspecting section provided with many probes contacted with respective pads of the substrate for liquid crystal display on the mounting table; a detection means for detecting the above-mentioned alignment marks while illuminating a light on the substrate for liquid crystal display on the above-mentioned mounting table; and a means for aligning the substrate with the probe on the basis of the detected results of the above-mentioned alignment marks, and contacting the pad with the probe to test a circuit on the substrate; the above-mentioned mounting table having a substrate mount surface treated with matting process to reduce a light reflecting coefficient.

By the use of an alignment mechanism, a substrate on a mounting table is illuminated to detect alignment marks; with the alignment marks taken as references, the substrate is aligned; and then the substrate is tested. A matting treatment has been applied to the surface of the mount surface of the mounting table, so that at the alignment, on a mount surface protruding beyond the substrate, an illuminating light is diffusely reflected, whereby the alignment marks on the substrate can be detected clearly without causing a halation due to reflected light. Therefore, the alignment, with the alignment marks taken as references, can be performed correctively.

A substrate inspecting equipment in connection with the present invention is provided with a mounting table on which a substrate having many pads connected to a pattern circuit to be inspected is placed; an inspecting section provided with many probes contacted with respective pads of the substrate on the mounting table; a load/unload section having at least one cassette housing a plurality of substrates; and a transfer means having an arm for unloading substantially horizontally a substrate from the cassette of the load/unload section, or loading substantially horizontally a substrate into the cassette; the arm distributing a deflection of the substrate occurring when the substrate is held into at least three places.

When a substrate is raised by an arm, the deflection of the substrate is distributed into three places, so that either at the central portion of the substrate or at both the ends thereof, an amount of the deflection becomes smaller than that for prior art.

BRIEF DESCRIPTION OF DRAWINGS

FIG. 11 is a flowchart showing a method for aligning a pad with a probe.

FIG. 15 is a sectional view showing a vicinity of the mount surface of a mounting table.

FIG. 16A is a mechanism block diagram showing a vacuum sucking mechanism of the mounting table.

FIG. 16B is a partially enlarged view showing the vacuum sucking mechanism of the mounting table.

FIGS. 17A, 17B are sectional views showing the mounting table which is broken away to help explain the loading/unloading of the LCD substrate.

FIG. 18 is a sectional view showing an alignment mechanism.

BEST MODE OF CARRYING OUT THE INVENTION

Figure 1:
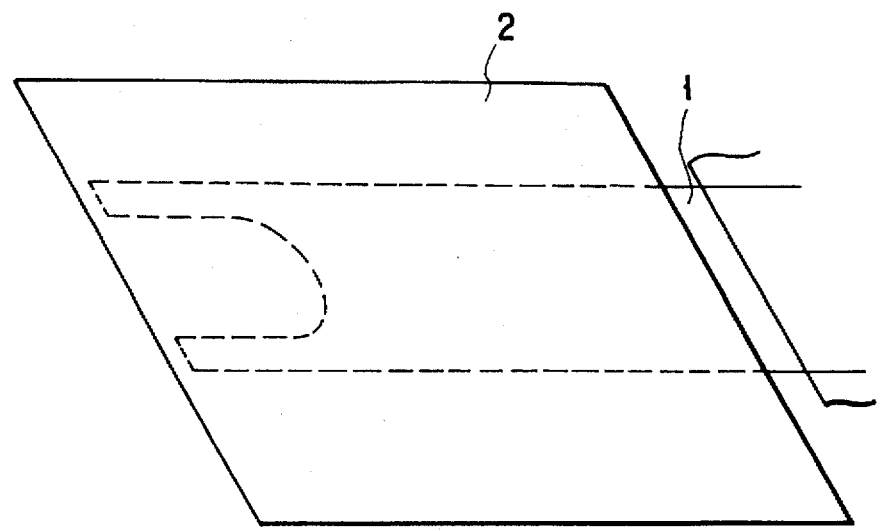
FIG. 1 is a perspective view showing an enlarged part of a conventional transfer device.
Figure 2:
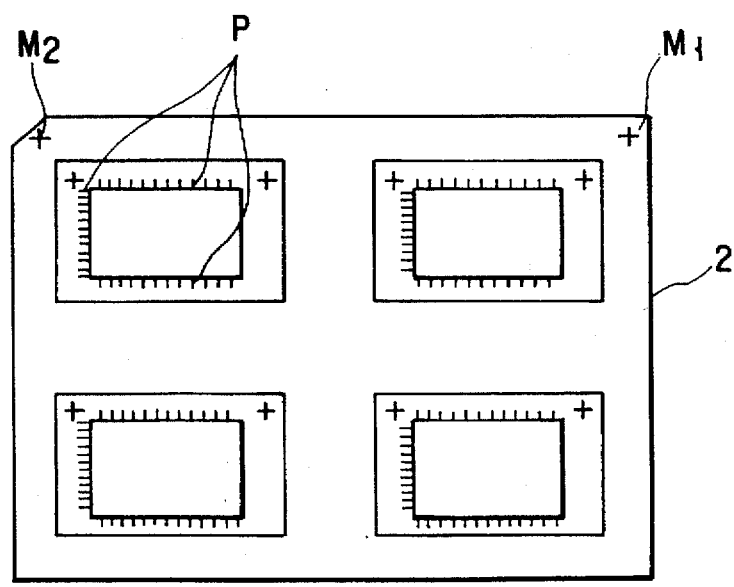
FIG. 2 is a typical plan view showing an outline of an LCD substrate.
Figure 3:
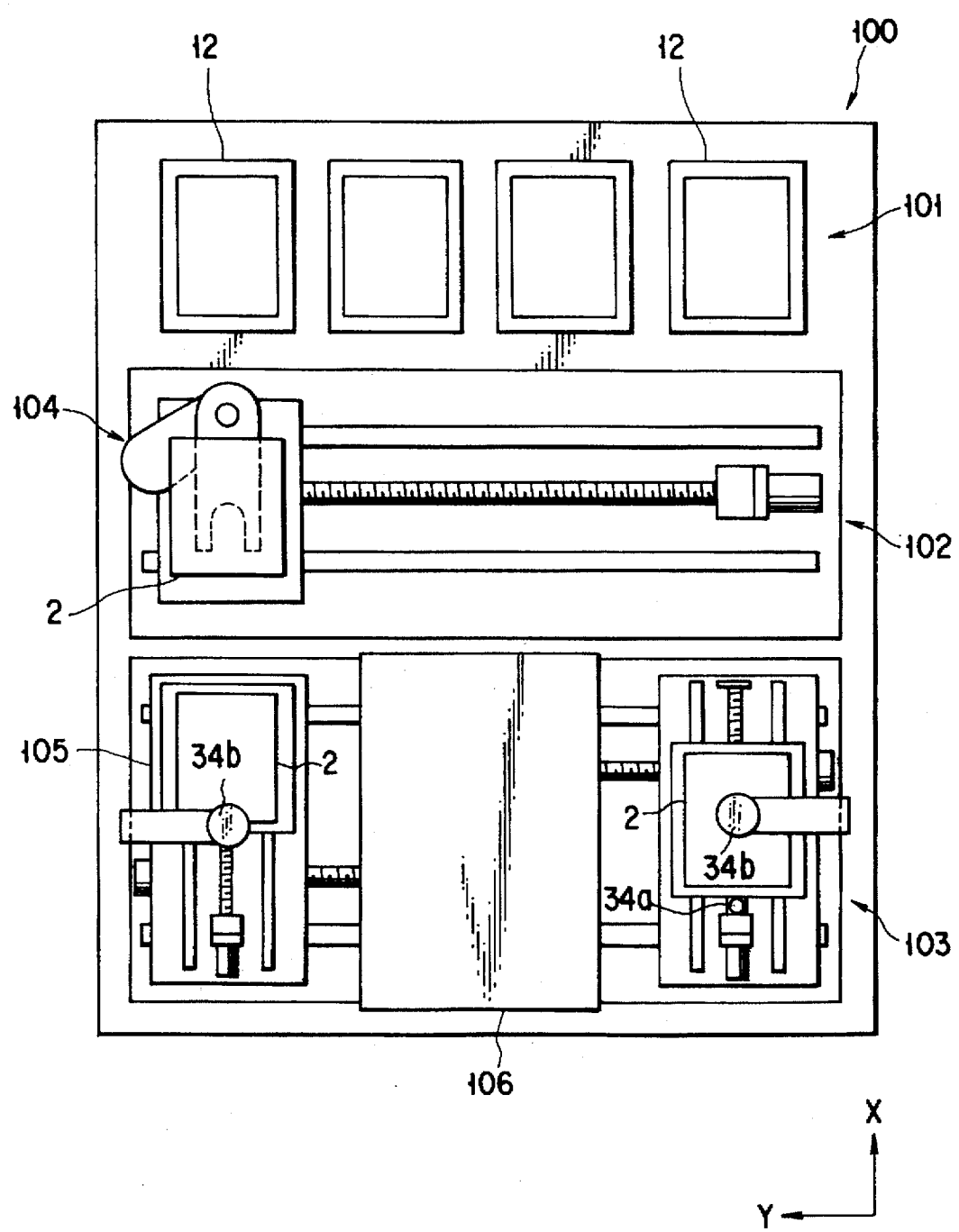
FIG. 3 is a plan view showing a substrate inspecting equipment in connection with a first embodiment of the present invention.

With reference to attached drawings, various preferred embodiments of the present invention will be explained hereinafter. In this embodiment, a case where the present invention is applied to an LCD prober will be explained. As shown in FIG. 3, an LCD prober 100 is provided with a loading/unloading section 101, a transfer section 102 and an inspecting section 103. The loading/unloading section 101 is provided with a table extending in the X-axis direction, on which table a plurality of cassettes 12 are placed. Housed in the cassette 12 is an LCD substrate 2 before or after being inspected. The transfer section 102 is provided between the loading/unloading section 101 and the inspecting section 103, and provided with a handler 104 having a multi-joint arm to transfer the substrate 2. The inspecting section 103 is provided with an alignment mechanism 4, a placing section 105, a measuring section 106 and a tester (not shown), which will be described later.

Then, with reference to FIGS. 4 through 10, the inspecting section 103 will be explained.

Figure 4:
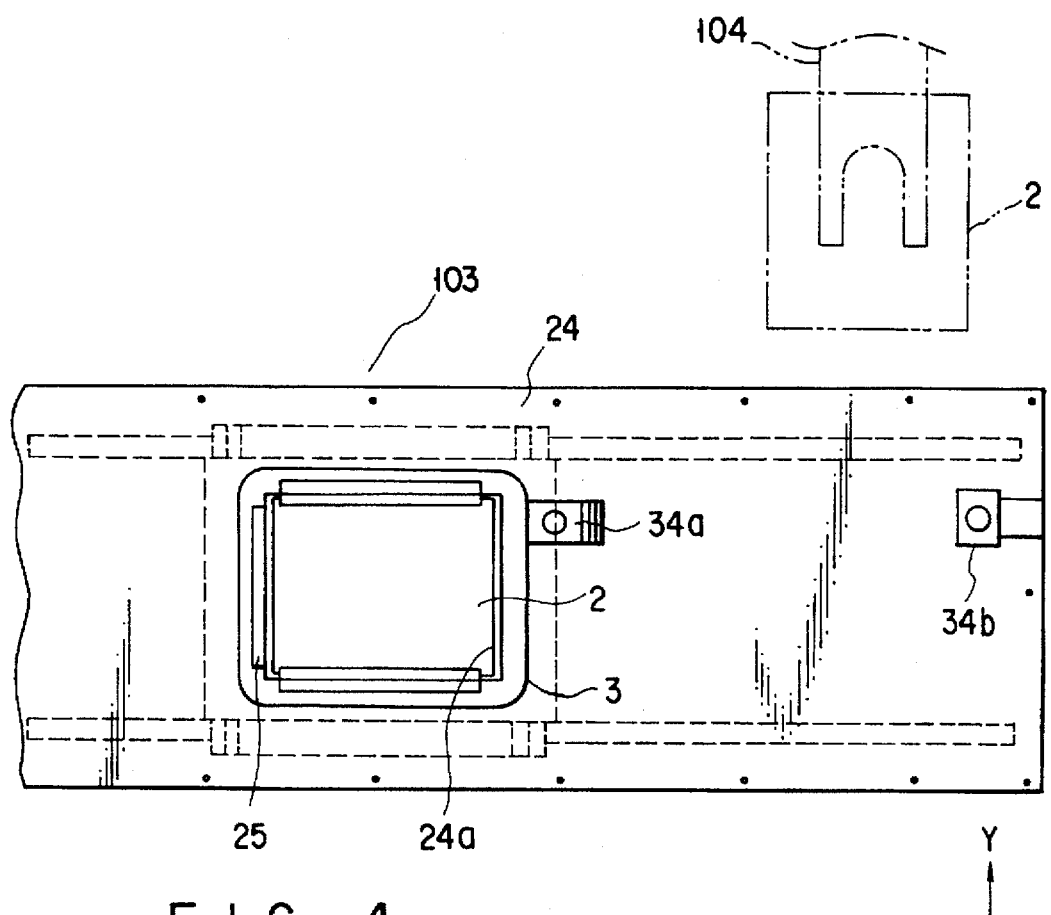
FIG. 4 is an enlarged plan view showing part of the substrate inspecting equipment of the first embodiment.
Figures 5A, 5B:
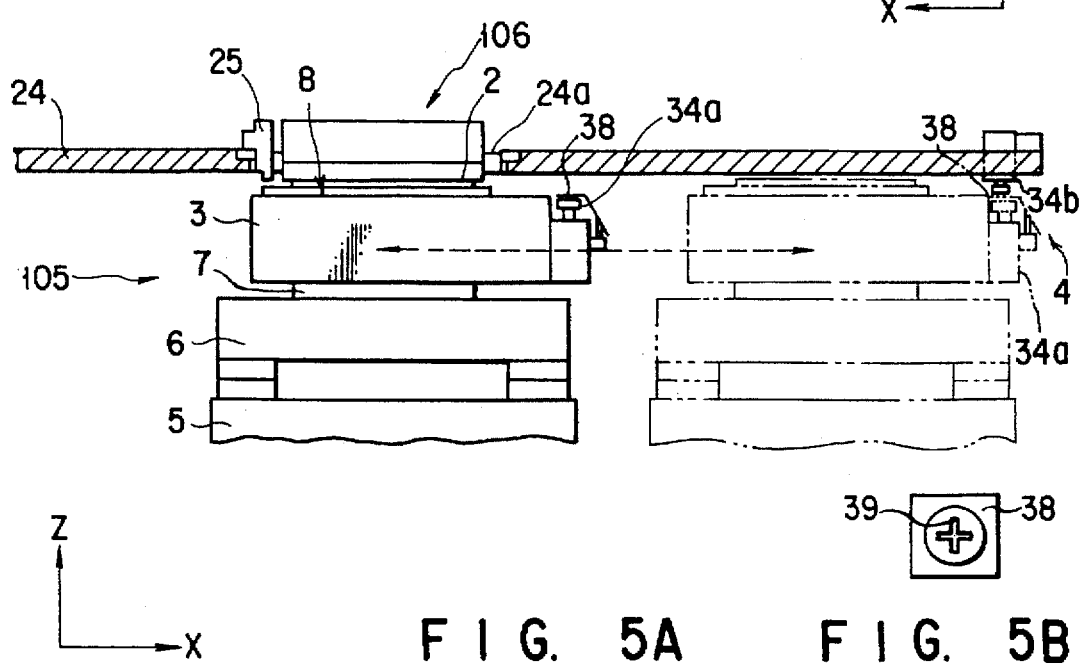
FIG. 5A is a view showing part of the substrate inspecting equipment of the first embodiment which is broken away, when viewed from the side.
FIG. 5B is a plan view showing part of an alignment mechanism.
Figure 6:
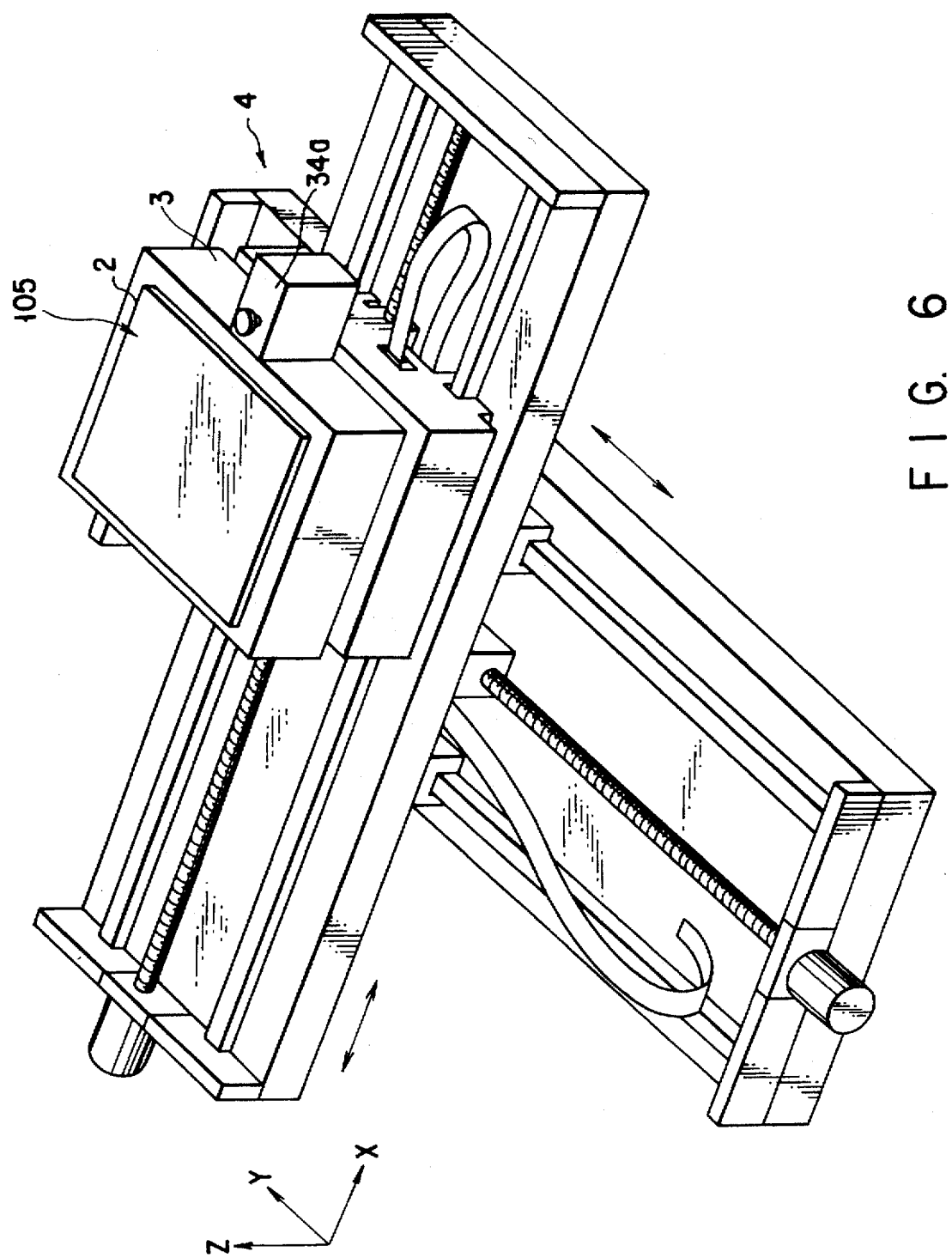
FIG. 6 is a perspective view showing typically a drive mechanism of the substrate inspecting equipment of the first embodiment.

As shown in FIGS. 4 and 5A, the alignment mechanism 4 is provided with optical positioning mechanisms 34a, 34b for positioning the substrate 2 on a stage 3 at a specified position, and moving mechanisms 5 through 8 for moving the stage 3. The optical positioning mechanisms are provided with respective first and second CCD cameras 34a, 34b connected through a camera drive circuit 46 to a controller 23. The first CCD camera 34a is mounted on the side of the stage 3 in such a manner that the optical axis is directed in the Z axis direction. The first CCD camera 34a is movable together with the stage 3. On the other hand, the second CCD camera 34b is mounted on a head plate 24 in such a manner that the optical axis is directed in the Z axis direction. The second CCD camera 34b is fixed to a specified position of the head plate 24.

As shown in FIG. 5B, a transparent glass 38 with a cross mark 39 is arranged in front of an objective lens of the first CCD camera 34a. As shown in FIG. 5A, the stage 3 of the placing section 105 is moved from a test position (or home position) to an alignment calibration position in the X-axis direction to position the first CCD camera 34a directly beneath the second CCD camera 34b, whereby stage 3 is alignment calibrated with respect to a probe 32.

As shown in FIG. 5A, the measuring section 106 is provided in an opening 24a of the head plate 24 and opposite to the placing section 105 located at the home position. The head plate 24 is provided in a manner to cover the moving region of the stage 3 in the X-axis direction. A probe board 25 is fixed through a holder onto the periphery of the opening 24a of the head plate 24. The probe board 25 is connected electrically with a tester (not shown) for sending a test signal to a circuit to be inspected.

Figure 7:
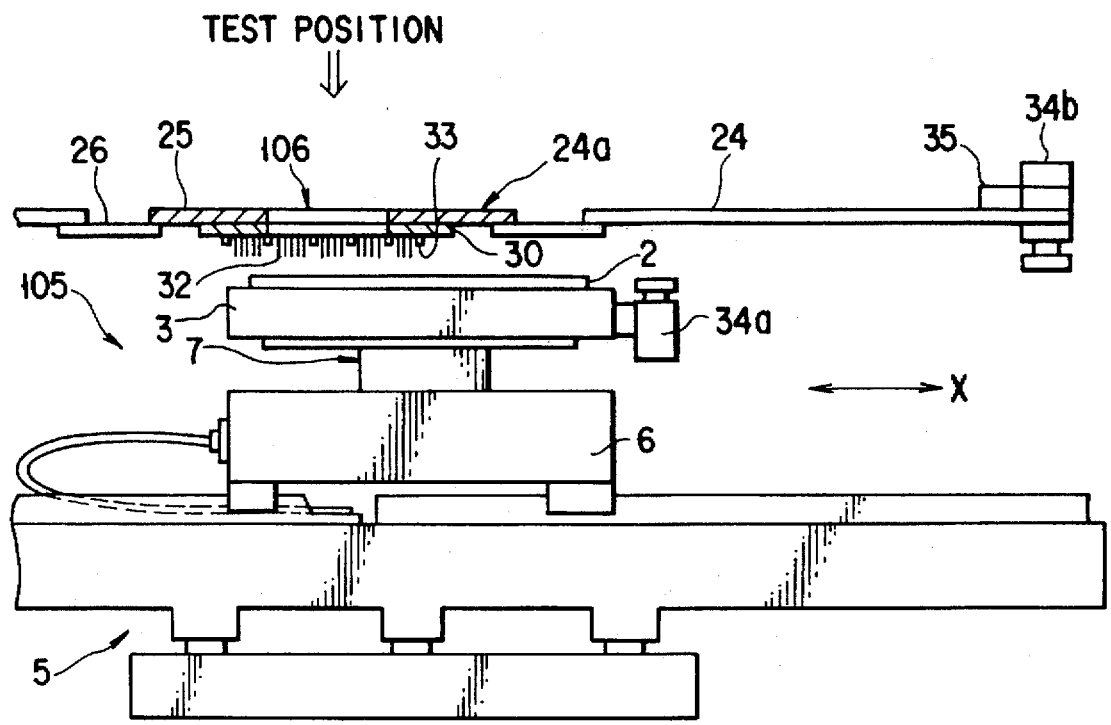
FIG. 7 is a view showing part of the substrate inspecting equipment of the first embodiment which is broken away, when viewed from the side.

As shown in FIG. 7, a bank of many probes 32 is provided on the under surface of the probe board 25. The bank of these probes 32 is arrayed in a manner to correspond to a bank of the electrode pods on the substrate 2.

Figure 8:
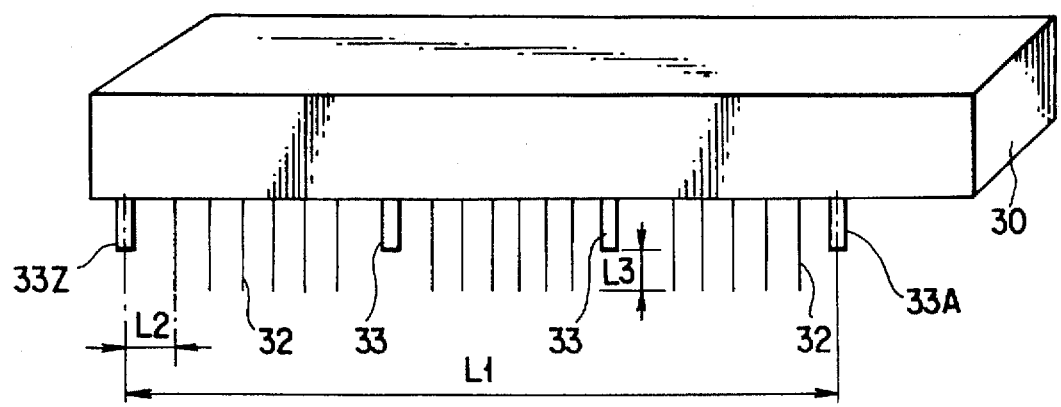
FIG. 8 is a perspective view showing a probe card provided with alignment pins.

As shown in FIG. 8, a plurality of alignment pins 33 are provided at positions away by a certain distance from the probes 32. The alignment pins 33 are used for positioning to set the probes 32 to specified positions. The length of the alignment pins is shorter reasonably than that of the probes 32. That is, even when the tip portion of the probe 32 is pushed on the pad to cause the length of the probes 32 to become a little short, the alignment pin 33 is still shorter than the probe 32. It is preferable that the alignment pin 33 is formed of an oxidation-resistant material such as stainless steel by which the surface contrast is not changed by oxidation.

The placing section 105 has the stage for placing the substrate 2. Provided below the stage 3 is a vacuum chuck (see FIG. 16A), so that the LCD substrate 2 is sucked and held under vacuum onto the upper face of the stage 3. Installed upward on the side of a mounting table 9 configured in a manner to be movable in the X-axis direction is a CCD camera 34 capable of picking up the opposite measuring section 106.

When the stage 3 is moved to an inspecting position in the X-axis direction, the alignment pin 33 of the probe board 25 can be picked up by the first CCD camera 34a. Subjects to be picked up are at least two alignment pins 33 as a reference of the probe board 25. For example, as shown in FIG. 8, the camera is set in a manner to pick up an alignment pin 33A at a position nearest to the second CCD camera 34b, and an alignment pin 33Z at a position farthest therefrom.

A distance $L_1$ between the nearest alignment pin 33A and the farthest alignment pin 33Z is constant. A mutual distance $L_2$ between the alignment pins 33 and the nearest probes 32 is constant, and a difference $L_3$ between the length of the probe 32 and that of the alignment pin 33 is also constant. These constant distances $L_1$, $L_2$, $L_3$ are stored previously in a memory of the controller 23 before inspection.

Figure 9:
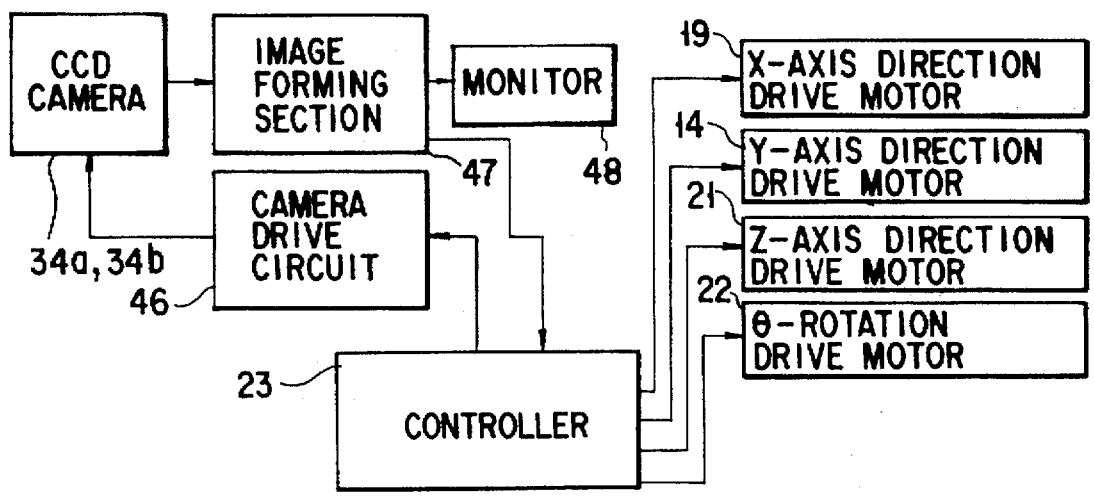
FIG. 9 is a block diagram showing a control circuit of a substrate inspecting equipment.

Then, with reference to FIG. 9, a method for forming an image pick up by the camera will be explained.

The CCD camera 34 is connected though the drive circuit 46 to an output of the controller 23. Further, the CCD camera 34 is connected though an image forming section 47 to a monitor 48, and an output of the image forming section 47 is connected to an input of the controller 23. The output of the controller 23 is connected to a power source circuit for an X-axis direction drive motor 19, a Y-axis direction drive motor 14, a Z-axis direction drive motor 21, and a control circuit of θ-rotation drive motor 22 so as to control the drive mechanism of the stage 3.

First, subjects are picked up by the CCD cameras 34a, 34b. The subjects to be picked up by the first CCD camera 34a are the alignment pins 33 and the probes 32. The subjects to be picked up by the second CCD camera 34b are the pads P and alignment marks 31a, 31b on the LCD substrate 2. An image picked up as image information is sent to the image forming section 47 in which the image is formed to display on a monitor 48.

The controller 23 is connected to another control means (not shown) for adjusting the position of the substrate 2 on the basis of the positional information sent individually from the CCD camera 34 of the alignment block. The control means (not shown) calculates the dislocation of the substrate 2 on the stage 3 at alignment positions in the X-axis, Y-axis, θ-rotation directions on the basis of the positional information sent to the CCD camera 34, and controls the X-axis direction drive motor 19, the Y-axis direction drive motor 14, the Z-axis direction drive motor 21, and the θ-rotation drive motor 22 according to these calculated results.

Then, the operation of the above-mentioned substrate inspecting equipment will be explained.

First, from the cassette 12 of the loading/unloading section 101, the LCD substrate not inspected is unloaded by the arm of the handler 104, and transferred from the loading/unloading section 101 to a delivery position of the inspecting section 103.

The LCD substrate 2 is placed on the stage 3 of the placing section 105, and sucked and held under vacuum. The position of the substrate 2 on the stage 3 in the Z-axis direction, when the substrate is transferred to a measuring position of the inspecting section 103, is detected by a height sensor (not shown). That is, a distance between a reference point (not shown) in the Z-axis direction and the LCD substrate 2 is measured correctively.

Then, with reference to the flowchart of FIG. 11, the alignment operation of positioning the LCD substrate 2 will be explained.

First, the stage 3 is moved from a moderate transfer position in the X-axis direction to position the lower first CCD camera 34a directly beneath the upper second CCD camera 34b. Then, the stage is moved so that a cross mark 39 is aligned with the screen center to match the optical axis of the lower camera 34a with that of the upper camera 34b. In this manner, the reference point of alignment is understood, whereby the position of the lower camera 34a is calibrated to complete an initial setting (step S1), Then, the stage 3 is moved in the X-axis direction and stopped at the inspecting position. Then, two alignment pins 33A, 33Z are picked up by the first CCD camera 34a (step S2). The positions of these two alignment pins 33A, 33Z become reference points on the probe board side, and used to position the pad P with the probe 32. This calibrating operation is previously stored in the controller 23 in order to be performed when the kind of the LCD substrate 2 to be inspected is changed, or when the probe 32 is exchanged.

Then, the view center of the first CCD camera 34a is aligned with the center of end faces of the alignment pins on the image picked up. This causes moving distances (X, Y, θ) as dislocations from the setting position (origin) of the stage 3 to be detected (step S3).

With the (X, Y) coordinates at this point taken as the origin of the stage 3, the coordinate position of the alignment pins 33 is corrected (step S4).

By the above-mentioned steps S1 through S4, the position of the probe 32 spaced apart by a specified distance from the position of the alignment pin 33 is set.

In this manner, the position at which the probe 32 is abutted by the pad P is calculated by the position of the alignment pin 33, so that positioning can be performed without being affected by a change (foreign matter deposit or deformation) of the probe 32.

Then, an operation of aligning the LCD substrate 2 to be inspected will be explained.

Figure 10:
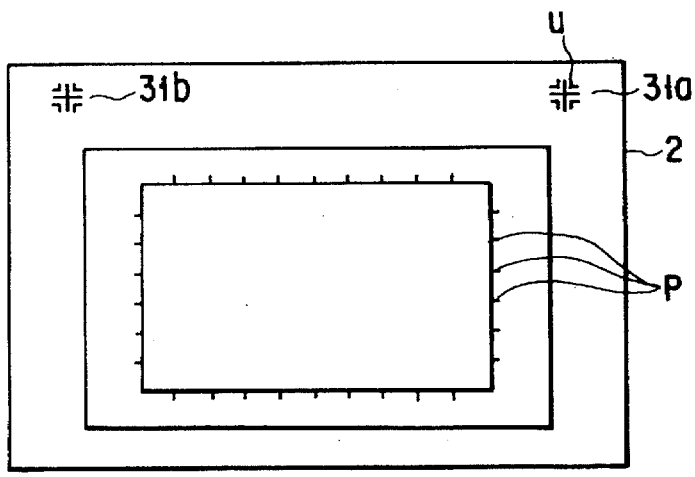
FIG. 10 is a plan view showing an LCD substrate.

As shown in FIG. 10, by the use of the upper camera 34b, the positions of the alignment marks 31a, 31b on the substrate 2 are understood to align these alignment marks 31a, 31b (step S5).

Figure 12:
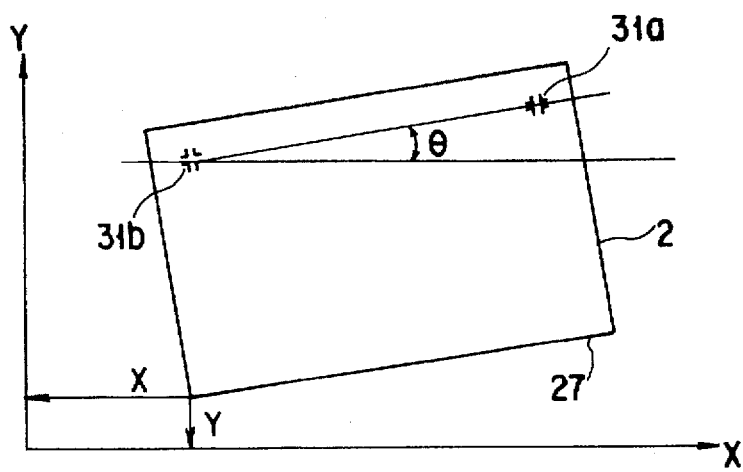
FIG. 12 is an X-Y coordinate axes chart to help explain a method for aligning a pad with a probe.

As shown in FIG. 12, the dislocations $(X_2, Y_2, \theta_2)$ of the substrate 2 from specified positions are calculated (step S6). Then, the respective drive motors 19, 14, 22 of the X-axis, Y-axis, θ-rotation are driven to move the stage 3 to specified positioning positions (step S7). Such execution of steps S5 through S7 causes the LCD substrate 2 to be aligned. These steps S5 through S7 are repeated for each exchange of the substrate 2 to be inspected.

After the above-mentioned alignment, the stage 3 is raised by a Z-axis direction moving mechanism 7 to push the pad P of the substrate 2 on the point of the probe 32. The stage is further raised from a position at which the pad P contacts with the probe 32 to an overdrive position. Thereafter, when a resistance value of contact between the probe 32 and the pad P becomes stable in a specified range, a test signal is sent from a tester (not shown) through the probe 32 to a pattern circuit to inspect.

Then, the inspected substrate 2 is transferred by the transfer mechanism 104 provided on the transfer section 102 from the inspecting section 103 to the loading/unloading section 102, and then housed in the cassette 12.

According to the inspecting method and equipment of the above-mentioned embodiment, the time required for the alignment of the probe 32 can be significantly shortened and the throughput is improved.

If the alignment pin is colored so as to be recognized more easily, the alignment time could be further shortened.

If the alignment pin employs a material such as ceramics by which the surface contrast is not changed, the recognition of the alignment pin could be performed constantly, thereby causing the measuring accuracy to become stable.

Then, with reference to FIGS. 13 through 18, a second embodiment of the present invention will be explained.

Figure 13:
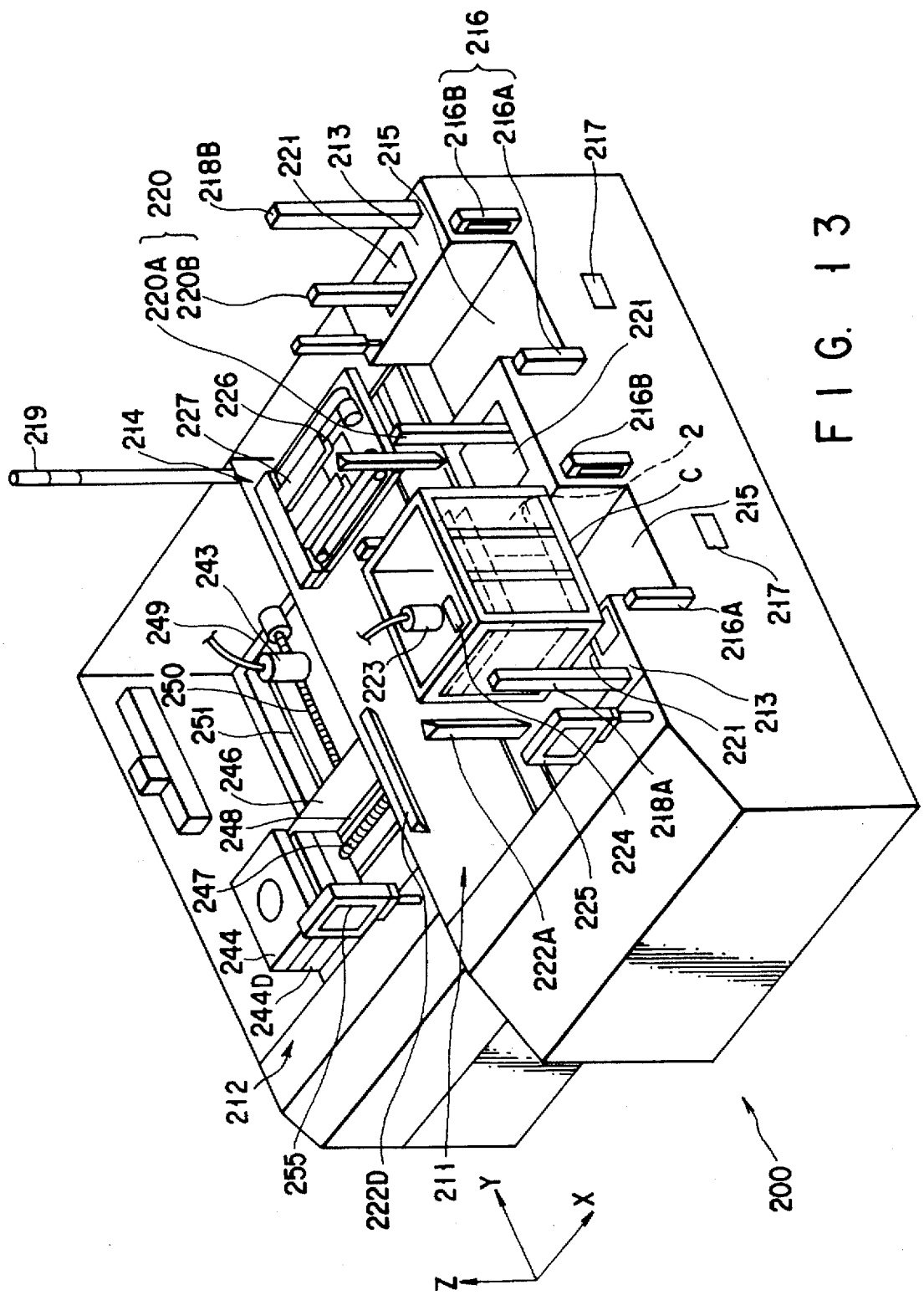
FIG. 13 is a plan view showing a substrate inspecting equipment in connection with a second embodiment of the present invention.

As shown in FIG. 13, an LCD prober 200 of a single stage type is provided with a handling section 211, an inspecting section 212, and a cassette placing section 213. The handling section 211 and the cassette placing section 213 are formed as one unit. The unit 212,213 and the inspecting section 212 are linked removably in a manner to be separable from each other. In the handling section 211, the LCD substrate 2 is loaded into or unloaded from a cassette C. The LCD substrate 2 is a glass plate, for example, of 370 mm in length, 470 mm in width and 0.7 mm in thickness.

The inspecting section 212 is adapted to probe test the substrate 2 unloaded from the handling section 211. The handling section 211 is provided with the cassette placing section 213 on which the cassette C capable of housing a maximum twenty five substrates 2 is placed. The handling section 211 is provided with a transfer device 214 by which the substrates 2 are unloaded one by one from the cassette C.

Figure 14:
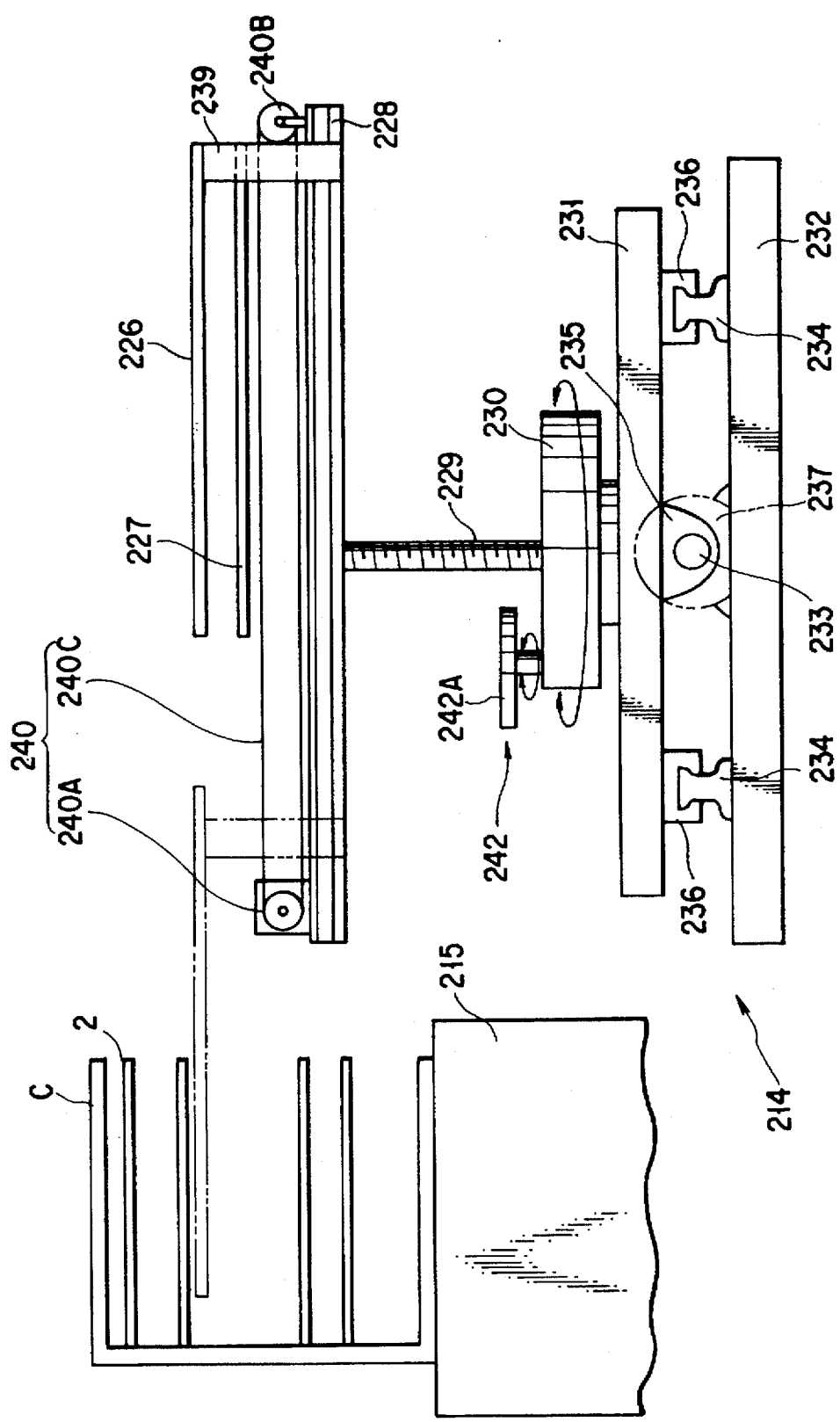
FIG. 14 is a view showing an LCD substrate transfer device which is provided on the substrate inspecting equipment, when viewed from the side.
Figure 20:
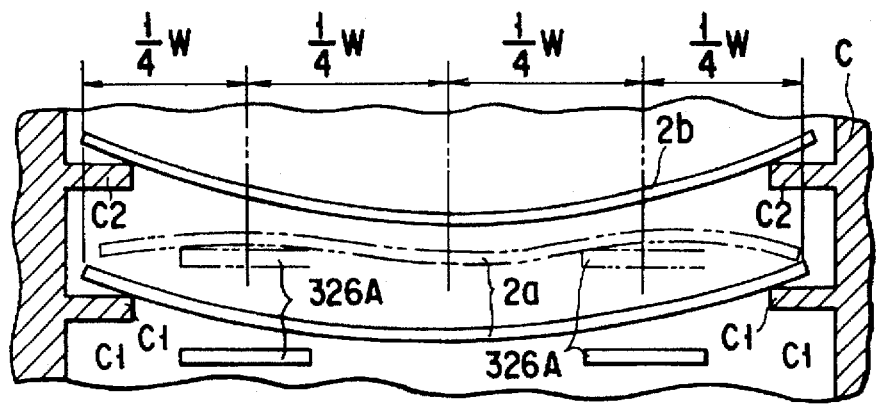
FIG. 20 is a front view showing the LCD substrate supported by a transfer arm of the present invention.
Figure 21:
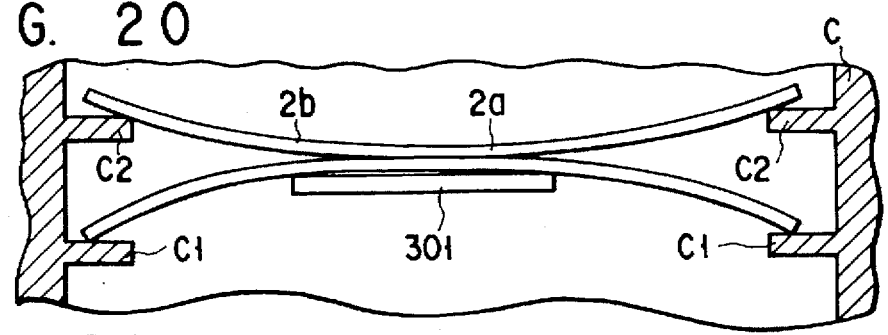
FIG. 21 is a front view showing the LCD substrate supported by a conventional transfer arm.

An opening for loading/unloading of the substrates 2 is formed on the entire face of the front plane of the cassette C. The cassette C is formed of an outer frame member and an intermediate reinforcing member, and formed on the inside of the outer frame member are support parts $C_1$, $C_2$, ... $C_n$ at specified pitch intervals. As shown in FIGS. 14 and 20, the substrate 2 is inserted between the support parts $C_1$ and $C_2$ by the transfer device (handler) 214, and supported horizontally by the support part $C_1$.

Provided on the front side of the LCD prober 200 is a running pass (not shown) for an automatic transfer vehicle (not shown), so that the cassette C is automatically loaded and unloaded between the automatic transfer vehicle and the LCD prober 200. The cassette C is adapted to be placed on cassette placing sections 213A, 213B. The two cassette placing sections 213A, 213B are arranged linearly in the Y-axis direction. Although the cassette placing section of this embodiment is adapted to unload two cassettes C, the cassette placing section may be extendedly formed so as to unload three or more cassette C.

The cassette placing sections 213A, 213B are formed with a groove space 215 into which an arm (not shown) of the automatic transfer vehicle is entered. The width of the groove space 215 is narrower than that of the cassette C. The cassette C is placed on the cassette placing section 213 in a manner to cross the groove space 215. Provided on the mount surface of the cassette placing section 213 are positioning members, though not shown, engaging with corner portions of the cassette C.

Provided on the side of the handling section 211 are cassette detecting devices 216 for detecting the cassette C at both the sides of the groove space 215. The cassette detecting device 216 is provided with a light emitter 216A and a light receiver 216B. The light emitter 216A employs, for example, a light emitting diode. These light emitter 216A and light receiver 216B are disposed on both the sides of the inlet of the groove space 215. When the cassette C is loaded onto or unloaded from the placing section 213 and thus crosses the optical axis of the light emitter 216A and the light receiver 216B, the detected signal is sent to the controller 23, whereby the entry/exit of the cassette C is detected. At the side of the handling section 211, a communication means 217 for performing, for example, an optical communication with an automatic transfer vehicle (not shown) is provided on the lower side of the groove space 215. The communication means 217 performs an optical communication with the automatic transfer vehicle, thereby allowing the cassette C to be loaded/unloaded.

A first object detecting device 218A is provided on the cassette placing section 213A at the left side; while a second object detecting device 218B is provided on the cassette placing section 213B at the right side. The first object detecting device 218A is provided with a light emitter and a light receiver. When an object except the cassette C intercepts an optical axis between both the 218A and 218B, a detected signal is sent to the controller 23, whereby the operation of respective drives stops, and at the same time, an alarm light goes on, or an alarm buzzer sounds.

Disposed on the cassette placing section 213 is a counter 220. The counter 220 is a counter for counting the number of the substrates 2 housed in the cassette C, and provided with a light emitter 220A and a light receiver 220B. These light emitter 220A and light receiver 220B are provided in an opening 221 formed on both sides of the groove space 215. The light emitter 220A and the light receiver 220B are linked with each other on the lower side of the groove space 215, and raised/lowered in the opening 221 by a drive mechanism (not shown) such as a ball screw. The counter 220, when raised/lowered in the opening 221, counts the number of light interceptions, whereby the number of the housed substrates 2 is counted.

Then, ionizers provided on the cassette placing section will be explained. The first and second cassette placing sections 213A, 213B are substantially identical with each other, so that the first cassette placing section 213A will be explained here, and the explanation of the second cassette placing section 213B is omitted.

The first cassette placing section 213A is provided with a first ionizer 222A and a second ionizer 222D. The fist ionizer 222A stands upright on the cassette placing section 213A. The height of the first ionizer 222A is substantially the same as that of the cassette C. On the other hand, the second ionizer 222D is horizontally provided on the upper side of the transfer device 214. The length of the second ionizer 222D is substantially the same as the width of the cassette C.

The first and second ionizers 222A, 222D are supplied with dry nitrogen gas or dry air, and when the supplied gas passes through between electrodes, the gas is electrolytically dissociated and thus ionized. When the ionized gas contacts with the substrate 2, an electrostatic charge is removed.

Disposed on the upper side of the cassette C is a cassette identification device 223 such as a bar-code reader. With the cassette identification device 223, an identification code 224 such as a bar code formed on the cassette C is read to identify the cassettes C in lots, and at the same time, according to the read contents, the inspecting section 212 is operated. The identification code 224 indicates cassette (or lot) information. The status of the handling section 211 is displayed according to detected signals from the sensors and the like provided in the handling section 211 on a display device 225 in front of the handling section 211. The display device 225 functions also as an operating panel.

As shown in FIG. 13, the transfer device 214 of the handling section 211 is provided between the cassette placing section 213 and the inspecting section 212. The transfer device 214 is moved in the X-axis, Y-axis, Z-axis directions and rotated by an angle of θ around the Z axis. Also, the transfer device 214 is provided with two arms 226,227 arranged on the upper/lower sides and mutually parallel. The arms 226,227 are supported by respective supporting plates 228.

As shown in FIGS. 13 and 14, the transfer device 214 is directed in the Y-axis direction when stopped. The arms 226, 227 are adapted to be movable above the supporting plates 228. The supporting plates 228 is linked through a ball screw 229 of an up/down drive mechanism to a rotating member 230 on the lower side. The arms 226, 227 are moved through the ball screw 229 in the Z-axis direction and rotated normally/reversely by an angle of θ through the rotating member 230. The ball screw 229 is rotated by a nut (not shown) (or worm gear) and a motor.

As shown in FIG. 14, the rotating member 230 is disposed on an X table 231. Provided on the lower side of the X table 231 is a base board 232 from front side to the rearmost side. Provided on the upper face of the base board 232 are a ball screw 233 in the X-axis direction and a pair of parallel rails 234 from front side to the rearmost side. The ball screw 233 is threadly engaged with a nut 235 mounted on the back of the X table 231, and the pair of rails 234 are engaged with an engaging member 236 mounted on the back of the X table 231. The ball screw 233 is linked with a drive shaft of a servo motor 37, so that the X table 231 is moved reciprocably by the servo motor 37 along the cassette placing section 213.

The upper/lower arms 226, 227 are driven independently of each other. For example, the upper arm 226 unloads the substrate 2 from the inside of the cassette C and loads the substrate 2 onto a substrate mounting table 244 of the inspecting section 212, while the lower arm 227 can unload the inspected substrate 2 from the substrate mounting table 244. Formed on the upper face of the arms 226, 227 are holes, whereby the substrate 2 is sucked under vacuum through a sucking piping and a vacuum evacuating device (which are not shown) mounted on the back of the respective holes.

In the following explanation, let the upper arm 226 be called the load arm, and the lower arm 227 be called the unload arm. The load arm 226 is linked through a linking member 239 to a Y-axis direction drive mechanism 240. This allows the load arm 226 to be moved reciprocably in the Y-axis direction on the supporting plate 228. The Y-axis direction drive mechanism 240 is provided with a pulse motor 240A, a rotating roller 240B and a timing belt 240C. The pulse motor 240A is disposed at the front end of the longitudinal-direction edge of the supporting plate 228. The rotating roller 240B is disposed at the rear end of the longitudinal-direction edge of the supporting plate 228. The timing belt 240C is in endless shape, and is installed between a pulley of the pulse motor 240A and the rotating roller 240B. The timing belt 240C is linked through the linking member 239 to the load arm 226.

The unload arm 227 is linked to a drive mechanism (not shown) similar to the above-mentioned Y-axis direction drive mechanism 240 on the supporting plate 228. The arms 226, 227 are moved independently of each other in the Y-axis direction on the supporting plate 228. The Y-axis direction drive mechanism 240 may also be a ball screw mechanism.

Figure 19:
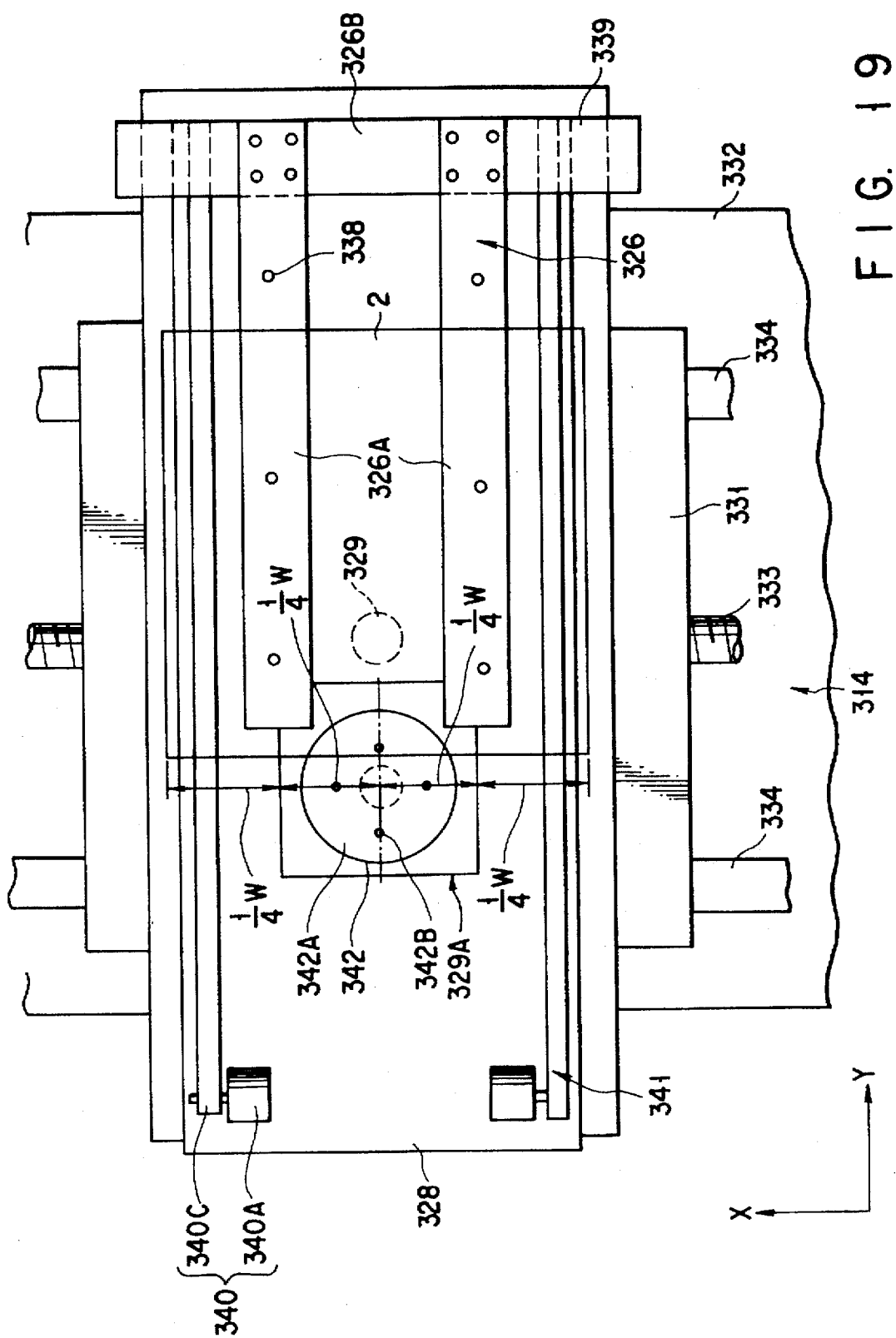
FIG. 19 is a plan view showing a transfer device for transferring the substrate.

As shown in FIG. 14 and FIG. 19, provided above the rotating member 230 is a prealignment mechanism 342 (242) rotating normally/reversely by an angle of θ around the Z axis. With the prealignment mechanism 342 (242), the substrate 2 unloaded from the cassette C is prealigned before being delivered to the substrate mounting table of the section 212. Provided in a mount surface 342A (242A) of the prealignment mechanism 342 (242) is an opening of a hole 342B (242B) communicating with a vacuum evacuating pump (not shown), so that the substrate 2 is sucked and held by the mount surface 342A (242A).

Formed on the supporting plate 228 is an opening 329A (229A) opened on the upper side of the above-mentioned prealignment mechanism 342 (242). When the load arm 226 and the unload arm 227 are lowered, the mount surface 242A protrudes through the opening 329A (229A) upward from the supporting plate 228, receives the substrate 2 from the arms 226, 227 to prealign the substrate 2.

Provided on the path for transferring the substrate 2 from the cassette placing section 213 to the inspecting section 212 is a substrate identification device 243. The substrate identification device 243 is adapted to read an identification code (such as a bar code) from the substrate 2 held by the load arm 226. The reading of the identification code allows the substrates 2 delivered to the inspecting section 212 to be individually identified and according to the identified contents, a probe test to be performed. The above-mentioned identification code indicates information representing features of the substrates 2.

Further, a substrate mounting table 244 is provided so that the substrate 244 is movable in the X-axis, Y-axis, Z-axis directions and rotatable by an angle of θ. The substrate mounting table 244 is disposed on a Z-base 244D. The Z-base 244D is adapted to be movable in the X-axis direction through a ball screw 247 and parallel rails 248 disposed on the upper face of an X-axis table 246. The X-axis table 246 is adapted to be movable in the Y-axis direction through a ball screw 250 and parallel rails 251 disposed on the upper face of a base board 249.

The above-mentioned substrate mounting table 244 is made of aluminum or an alloy thereof. Applied to the surface of the substrate mounting table 244 is an anodic oxidation treatment of aluminum (anodized aluminum treatment) as a matting treatment. As shown in FIG. 15, an aluminum metal 244B is covered with a porous layer film 244a treated by the anodized aluminum. The fine pores of the porous layer film 244a can be adjusted appropriately as required. In this embodiment, the dyeing treatment following the anodized aluminum treatment causes the surface of the substrate mounting table 244 to assume a black color. With such a black-color anodized aluminum treatment, when an illuminating light at alignment is incident upon the θ-table 244A, a reflected light from the substrate mounting surface is reduced, thereby preventing a halation. As a result, the alignment marks 31a, 31b on the substrate 2 can be detected clearly.

The substrate mounting table 244 comprises the θ table 244A, four lifter pins 244B, another θ table 244C, and a ball screw 244E. The lifter pins 224B extend upwards to support a substrate 2. The θ table 244A is mounted on a cross-roller base 244C which is provided on the θ table 244C, and can be rotated. The Z base 244D is located below the θ table 244C. The ball screw 244E is coupled to the Z base 244D. The nut of the ball screw 244E is fastened to the back of the θ table 244C. Thus, the stand 244 is moved up and down as the ball screw 244E is rotated.

As shown in FIG. 17, the θ table 244A, is mounted on the cross roller bearings 244J provided on the upper surface of the θ table 244C. The table 244A has four through holes 244H, in which the lifter pins 244B are inserted.

When the θ table 244C is lowered, the Z base 244D abuts on the lower ends of the lifter pins 244B, pushing the pins 244B upwards. As a result, the vacuum pads 244G connected to the pins 244B abut on the lower surface of the substrate 2, moving the substrate 2 upwards. Each lifter pin 244B is a hollow cylinder, having an inner passage which communicates with an exhaust pipe 244U. The substrate 2 can therefore be attracted to the vacuum pads 244G by suction force.

As shown in FIG. 16A, formed in the substrate mounting surfaces of the θ-table 244A and the θ-base 244 are grooves 252A, 252B, 253A, 253B, 254A, 254B, 255A, 255B. Of the grooves, those 252A, 252B, 253A, 253B, 254A, 254B are endless grooves each exhibiting a rectangular shape concentric with the outer peripheral profile of the rectangular mount surface 244c, and formed at specified pitch intervals from the outer periphery side of the mount surface 244c toward the inside. For this reason, the grooves 252A, 252B, 253A, 253B, 254A, 254B are different in the outer peripheral length from each other. On the other hand, the grooves 255A, 255B on the innermost periphery are endless ones each exhibiting a circular, concentric shape.

As shown in FIG. 16B, the grooves 252A, 252B, the grooves 253A, 253B, and the grooves 254A, 254B are communicated in the mounting table 244 through communicating grooves 252C, 253C, and 254C, respectively, with each other. The grooves 255A, 255B, though not shown, on the innermost periphery are communicated in the inside with each other. Formed at the intersection of the groove 252A and the communicating groove 252C are twelve holes 252D at specified intervals. These holes are communicated through a pass (not shown) formed inside the peripheral placing member 244C and pipings 256 with a vacuum evacuating pump 257. Disposed in the piping 256 are motor-operated valves 258.

The vacuum evacuating pump 257 and the motor-operated valve 258 are connected through control wirings 259, 260 to a controller 261, by which controller the evacuation is controlled.

The sucking action of the grooves 252A, 252B, 253A, 253B, 254A, 254B of the θ-base (peripheral placing member) 244C and the grooves 255A, 255B of the θ-table (central placing member) 244A can be controlled individually by controlling the opening/closing of the respective motor-operated valves 258 by the controller 261 in a state in which the vacuum evacuating pump 257 is driven. For example, where the substrate mounting table 244 unloads the substrate 2 from the transfer device 214, evacuating the inside of the grooves 255A, 255B of the θ-table 244A allows the substrate 2 to be sucked and held by the θ-table 244A as shown in FIG. 17. This allows the substrate 2 to be held reliably and stably in a stationary state, whereby the substrate 2 can be smoothly loaded onto/unloaded from the transfer device 214.

On the other hand, the control of the opening/closing of respective motor-operated valves 258 by the controller 261 causes the inside of all the grooves 252A, 252B, 253A, 253B, 254A, 254B, 255A, 255B to be evacuated where a large-size substrate 2A is held as shown in FIG. 16A. On the other hand, where a small-size substrate 2B is held, the inside of only the grooves 253A, 253B, 254A, 254B, 255A, 255B is evacuated, while the inside of the grooves 252A, 252B on the outermost periphery is not evacuated.

When the substrate 2 is released from the vacuum pads 244G, the grooves 252A to 255B come to communicate with the atmosphere.

At the alignment position in the above-mentioned inspecting section 212, as shown in FIGS. 13 and 18, a slender alignment mechanism 262 is fixed onto a head plate 263 in a manner to be directed in the X-axis direction.

When the substrate mounting table 244 holding the substrate 2 reaches the alignment position, this alignment mechanism 262 is adapted to detect the two alignment marks 31a, 31b, as shown in FIG. 10, and with these cross marks taken as references, to align the substrate 2.

The alignment mechanism 262 is provided with a light source 262B, a first reflector 262C, a second reflector 262D, a third reflector 262E and a drive means 262F. The light source 262B is a light source for illumination housed in an end within a slender enclosure 262A. The first reflector 262C is disposed on the light source 262B side. The second reflector 262D is disposed at a position spaced apart from and opposite to the reflector 262C. The third reflector 262E is located between both 262C and 262D, and provided at a position somewhat thereabove. The drive means 262F is provided with an electromagnetic plunger and the like for moving advance the reflector 262E between the first and second reflectors 262C, 262D. Disposed on the lower side of the first reflector 262C is a CCD camera 264 opposite thereto. The above-mentioned enclosure 262A is provided with an opening on the under face, which opening is closed by the head plate 263.

The first reflector 262C is arranged with the mirror face directed to the second and third reflectors 262D, 262E so that the first reflector 262C crosses with the optical axis of a lens 264A of the CCD camera 264 at an inclined angle of 45° to the optical axis. Also, the first reflector 262C is formed as a half mirror for transmitting a light of the light source 262B. These second and third reflectors 262D, 262E are reverse in the inclined direction to the first reflector 262C, and the distance between both 262D and 262E is coincident with that between the cross marks 31a and 31b. Further, the head plate 263 is formed with openings 263A, 263B, 263C located under the respective reflectors 262C, 262D, 262E. These openings 263A, 263B, 263C may be formed as an integrated slender opening.

Therefore, where the cross mark 31a is detected, as shown in FIG. 18, a positional state is allowed to change such that the third reflector 262E is moved back to the upper side of the enclosure 262A by the drive means 262F. In this state, when the light source 262B is turned on, the light transmits the first reflector 262C and reaches the second reflector 262D, at which the light changes in the proceeding direction by an angle of 90° and incident through the opening 263C upon the cross mark 31a. The reflected light from the cross mark 31a is changed in the proceeding direction by the second reflector 262D and the first reflector 262C, and reaches through the opening 263A to the CCD camera 264. This causes the cross mark 31a to be picked up by the CCD camera 264.

On the other hand, where the cross mark 31b is detected, the third reflector 262E is allowed to advance inside the enclosure 262A. This causes the light source 262B to illuminate through the third reflector 262E the cross mark 31b on the lower side thereof, and then, as described above, the cross mark 31b to be picked up by the CCD camera 264.

An image signal from the CCD camera 264 is image formed by an image forming means (not shown) and sent to a display device 265 disposed in front of the inspecting section 212, at which display device the cross mark 31a or 31b is displayed on the display screen. Therefore, where the line connecting the cross marks 31a, 31b is inclined from the X direction, the rotating of the substrate mounting table 244 through a computer allows an alignment to be performed.

The above-mentioned CCD camera 264 is adapted to pick up the probes 32 fixed to the head plate 263 and on the basis of two probes used as references at inspecting, to perform positioning of the substrate mounting table 244. The substrate mounting table 244 is adapted to move the substrate 2 to a position directly beneath the probe 32 of the inspecting section 212, then to raise the substrate mounting table 244 so as to contact the probe 32 with the pad P, thereby performing test. The distance between the substrate mounting table 244 and the probe 32 is detected by a height sensor (not shown) consisting of a capacitance sensor and the like.

Then, an alignment operation in the above-mentioned devices will be explained.

When the substrate 2 is sucked and held on the substrate mounting table 244, the cross marks 31a, 31b are detected through the alignment mechanism 262, and on the basis of these detected signals, the substrate mounting table 244 is moved to align the substrate 2. At this point, in the alignment mechanism 262, the cross marks 31a, 31b are illuminated by the light source 262B, and at the same time, the mount surface 244c of the substrate mounting table 244 protruded outward from the substrate 2 is also illuminated. However, the mount surface 244c is of black color, so that the reflected light from the mount surface 244c is significantly reduced, thereby preventing a halation on the display screen of the display device 265. The alignment marks 31a, 31b are displayed clearly on the display screen, thereby allowing the alignment of the substrate 2 to be correctively and reliably performed. Thereafter, the substrate 2 is allowed to move to a position under the probe 32 to perform probe test.

During probe test, the transfer device 214 is moved to the cassette C to unload the next substrate 2, and further moved to the alignment position to wait for the completion of the inspection. When the inspection is completed, the substrate mounting table 244 comes to the alignment position side to face the transfer device 214 having already waited for. Then, the unload arm 227 of the transfer device 214 advances toward the substrate mounting table 244 to unload the inspected substrate 2, while the load arm 226 advances to load the substrate 2 to be inspected next onto the substrate mounting table 244. Thereafter, similar operations are repeated.

Then, with reference to FIGS. 19 through 22, a third embodiment will be explained. The explanation of parts of the third embodiment common to those of the above-mentioned embodiments is omitted.

As shown in FIG. 19, an inspecting equipment 314 is provided with a handling section 311 and an testing section 312. The handling section 311 is provided with a load arm 326 for loading/unloading the substrate 2. The load arm 326 is provided with two parallel arm members 326A.

As shown in FIG. 19, provided on the lower side of an X table 331 is a base board 332. Disposed on the upper face of the base board 332 are an X-axis direction ball screw 333 and a pair of rails 334 arranged in a manner to catch the ball screw 333. The ball screw 333 is threadly engaged with a nut 335 mounted on the back of the X table 331, and the pair of rails 334 are engaged with engaging members 336 mounted on the back of the X table 331, so that the X table 331 is moved reciprocably by a pulse motor linked to the ball screw 333 along a cassette placing section 313.

Arms 326, 327 will be explained in detail. The arms 326, 327 are formed in a substantially same shape. The arms 326, 327 are driven independently of each other.

Figure 22:
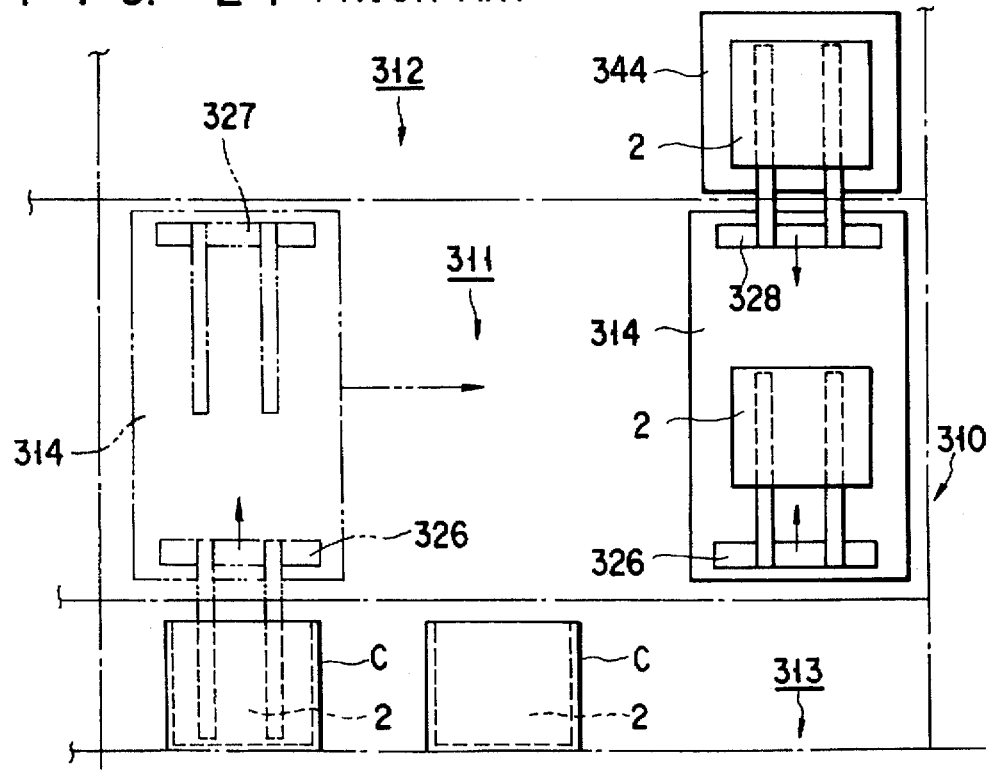
FIG. 22 is a plan view showing an LCD cassette and the transfer device.

As shown in FIGS. 19, 20, 22, the load arm 326 is formed in such a manner that the load arm is located on two outer axial lines of four longitudinal ones passing through centers of the width of the branch supporting members 326A, 326A which divide the width W of the substrate 2 into four equal parts. Therefore, even for a large, thin substrate 2 of, for example, 550 mm in length, 650 mm in width and 0.7 mm in thickness, when the LCD substrate 2 is supported by the supporting members 326A, 326A of the load arm 326, the deflection of the substrate 2 are distributed into three places by the branch supporting members 326A, 326A, thereby allowing the deflection at respective parts to be significantly reduced. For this reason, as shown in FIG. 20, even if the substrate 2, when unloaded from the cassette C, is raised in the cassette C by the load arm 326, the substrate 2 will not contact with another substrate 2 directly thereabove.

As shown in FIG. 20, in this embodiment, the distance between the branch supporting members 326A, 326A is set such that the members 326A, 326A are located at positions away by about a quarter (¼ W) of the full width W from either end of the substrate 2, so that the deflection at the outer side (substrate peripheral portion) of the branch supporting members 326A, 326A becomes substantially equal to that at the intermediate portion (substrate central portion) of the branch supporting members 326A, 326A. The deflection when the substrate 2 is allowed to stand still on the load arm 326 becomes substantially equal to that when the substrate 2 is raised, so that the substrate 2, when unloaded, is hardly shaken up/down and thus in a stable state.

According to the transfer device of the above-mentioned embodiment, the deflection of the substrate 2 are distributed into three places by the branch supporting members 326A, 326A, so that an individual deflection becomes small. For this reason, even a large, thin LCD substrate 2 of 550 mm in length, 650 mm in width and 0.7 mm in thickness is not damaged and can be transferred safely and reliably.

Then, with reference to FIGS. 23 through 26, a fourth embodiment will be explained. The explanation of parts the third embodiment common to those of the above-mentioned embodiments is omitted.

Figure 23:
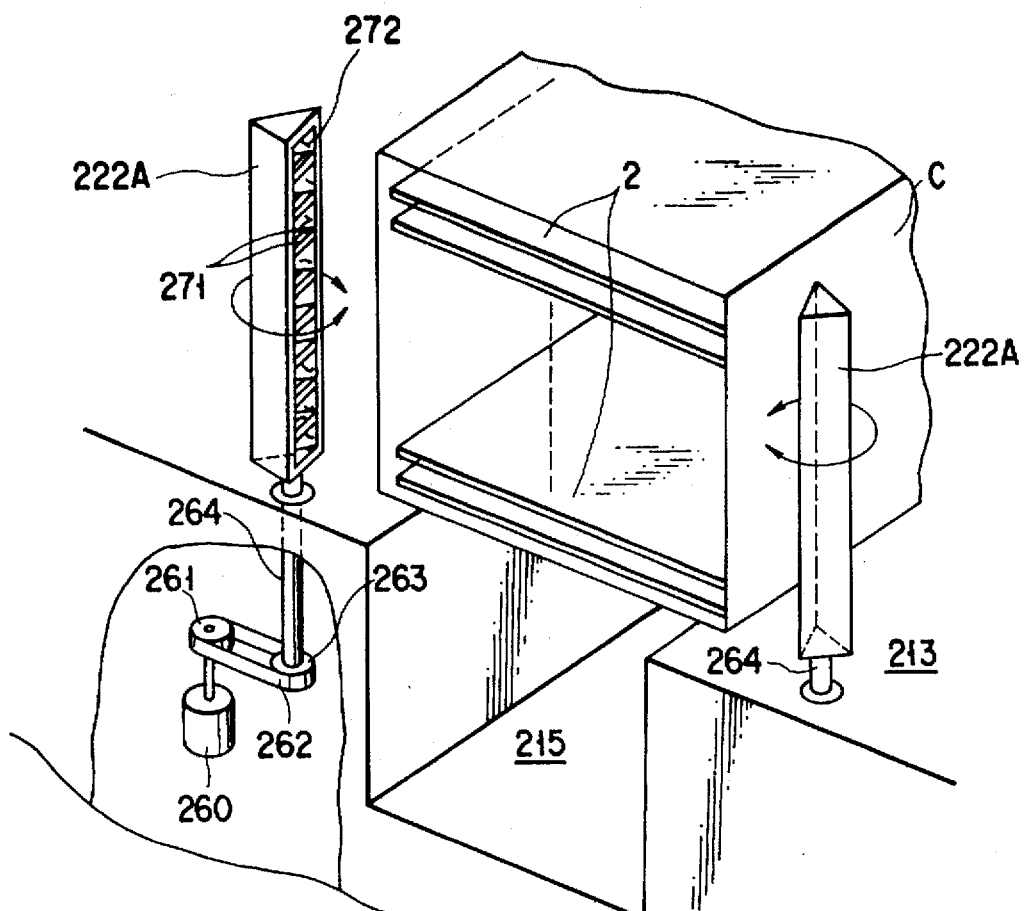
FIG. 23 is a perspective view showing the LCD cassette provided with a first ionizer.
Figure 25:
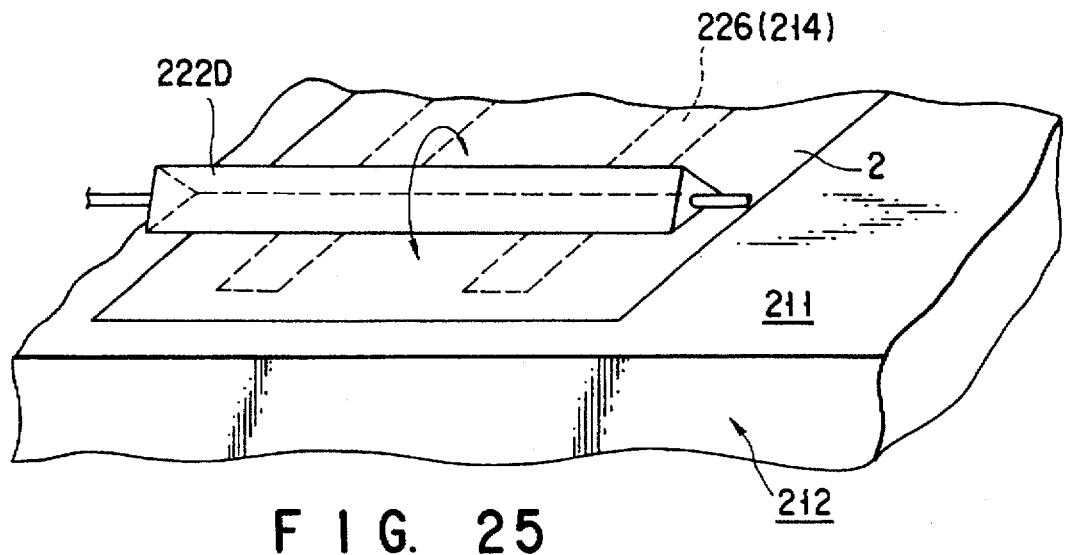
FIG. 25 is a perspective view showing the second ionizer provided on a transfer path of the transfer device.

As shown in FIGS. 13, 23, 25, the cassette placing section 213 of this embodiment are provided with two first ionizers 222A, and the handling section 211 is provided with one second ionizer 222D. The two first ionizers 222A are arranged in a manner to catch the opening of the cassette C placed on the cassette placing section 213 from both the sides.

As shown in FIG. 23, the first ionizers 222A have a plurality of discharging chambers 272 arrayed in series and in the Z-axis direction. Provided in the respective discharging chambers 272 are a pair of needles 271, 271. Provided in the discharging chambers 272 are openings of gas supply passes (not shown) communicating with a gas supply source (not shown), so that dry air or dry nitrogen gas is emitted into the discharging chambers 272. When a discharging is allowed to occur between the pair of needles 271, 271, the gas molecules are dissociated to generate ions. The generated ions are supplied toward the cassette C.

Further, the first ionizers 222A are provided with swivel mechanisms 261 through 267. The swivel mechanism consists of a motor 260, a drive pulley 261, a belt 262, a driven pulley 263 and a vertical coupling shaft 264, so that the first ionizer 222A is swiveled about the Z axis. The swivel angle of the first ionizer 222A is preferably in a range from 15° to 45°.

Figure 24:
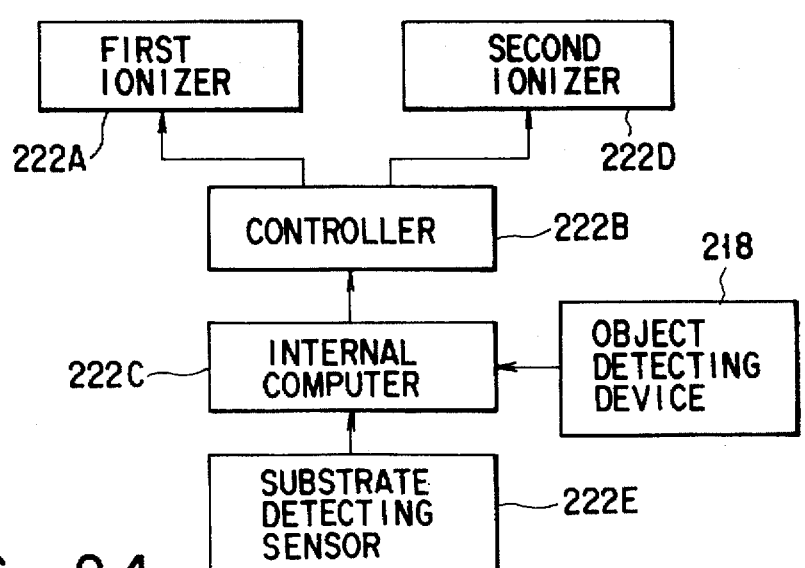
FIG. 24 is a control block diagram of the first and a second ionizers.

As shown in FIG. 24, both the power source for discharging the ionizers 222A and the power source for driving the motor 260 are connected to a loader controller 222B. The loader controller 222B is adapted to control the ionizers 222A on the basis of a signal from a computer 222C. The computer 222C is connected with the above-mentioned object detecting devices 218 and a substrate sensor 222E. The first ionizer 222A is adapted to be operated through the loader controller 222B on the basis of a signal from the object detecting devices 218. The ionizers 222A are operated intermittently under the control of the loader controller 222B so as to remove the electrostatic charge of the cassette C.

As shown in FIG. 25, disposed on the path through which the substrate 2 is transferred by the use of the transfer device 214 from the cassette C to the inspecting section 212 is the second ionizer 222D for removing individually the electrostatic charge of the substrate 2. The transfer path is formed between the cassette placing section 213 and the inspecting section 212. The ionizer 222D is disposed at a position at which the ionizer waits for in order to deliver the substrate 2 to the inspecting section 212. The second ionizer 222D has substantially the same function as that of the first ionizer 222A. The ion feeder of the second ionizer 222D is disposed in a manner to be opposite to and on the upper side of the substrate 2 supported by the load arm 226 of the transfer device 214. A substantially the same mechanism as the above-mentioned swivel mechanisms 260 through 264 is mounted to the second ionizer 222D so as to rotate normally/reversely by a specified angel on the upper side of the substrate 2.

The control system of the second ionizer 222D, as shown in FIG. 24, for example, is operated after a specified time has elapsed on the basis of an inspected signal of the substrate sensor 222E disposed on the load arm 226.

Figure 26:
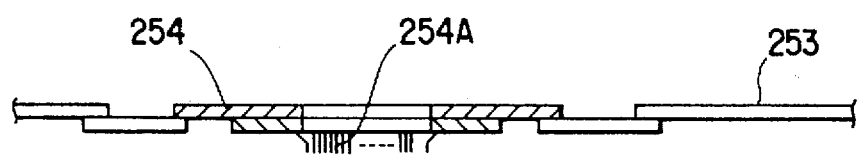
FIG. 26 is a sectional view showing a state immediately before the pad of the LCD substrate is contacted with the probe.
Figure 26:
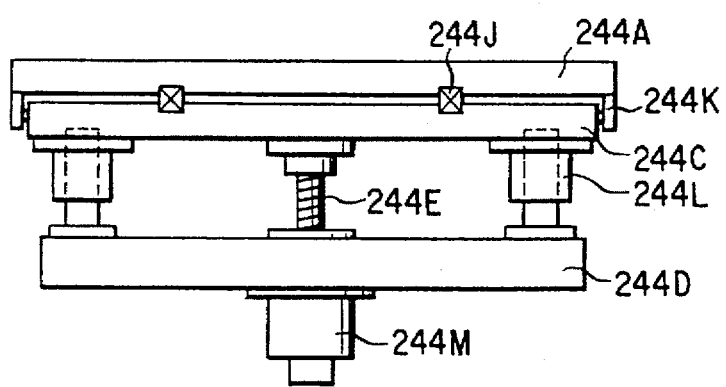

As shown in FIG. 26, the substrate mounting table 244 is provided with a rod 244B having a circular placing member 244A, a rectangular placing plate 244C surrounding the circular placing member 244A of the rod 244B, an enclosure 244D disposed on the lower side of the placing plate 244C, and a drive source, for example, an air cylinder 244E disposed in the enclosure 244D. Linked to the back of the placing plate 244C is a cylinder rod of the air cylinder 244E, so that the placing plate 244C is lowered from the circular placing member 244A of the rod 244B by the air cylinder 244E. Formed on the circular placing member 244A and the placing plate 244C are holes (not shown) for sucking the substrate 2. The circular placing member 244A is housed in a concave portion 244F formed in the central portion of the placing plate 244C, and in a state in which the circular placing member 244A is housed, the upper faces of both the 244A and 244C are arranged without step difference in a manner to be flush with each other. Formed on the center of the concave portion 244F is a through hole 244G of the rod 244B.

Industrial Applicability

According to the present invention, it is possible to maintain the alignment accuracy of a substrate constant by, upon positional alignment of the substrate, detecting the position of a reference (second alignment member) for alignment which is provided near an inspection section, finding an initially stored contact position of the inspection section, by a detected value, which is contacted with the substrate, and aligning the substrate while moving a placing stand with the substrate placed in the contacting position.

Further, according to the present invention, an alignment mark is detected by an alignment mechanism, while illuminating a substrate on a placing stand, and the substrate is tested after aligning the substrate with an alignment mark as a reference. Since, upon alignment, a matting process is applied to the placing surface of the placing stand, illuminating light is diffusely reflected, so that the alignment mark of the substrate can be clearly detected without causing a halation due to reflected light. It is, therefore, possible to accurately achieve alignment with the alignment mark as a reference.

Further, according to the present invention, the deflection of the substrate is distributed at three places when the substrate is raised by an arm, so that, lither at the central portion of the substrate or at both the end thereof, an amount of deflection becomes smaller than that for the prior art.

We claim:

1. A substrate inspecting method in which a pad of a substrate is aligned with a probe; the pad is contacted with the probe; and a test signal is sent to a pattern circuit formed on the substrate to inspect; having:

a step of storing as initial setting data the positional information of a mounting table on which the substrate is placed and the positional information of the probe;

a step of moving a first alignment member provided at a position away by a specified distance from the mounting table together with the mounting table, and aligning the first alignment member with respect to a second alignment member fixed to a position away by a specified distance from the probe to provide an aligned position;

a step of calculating a distance between the aligned position and the mutual probe/pad contact position on the basis of the previously stored initial setting data, and moving the mounting table on the basis of the calculated results to position the pad at the probe; and a step of contacting the pad of the substrate on the mounting table with the probe, and sending a test signal to a pattern circuit on the substrate to inspect.

2. A method according to claim 1, wherein the second alignment member is provided in the vicinity of an inspecting assembly section for contacting the pad with the probe, and the moving distance of the mounting table in said positioning step is short.

3. A method according to claim 1, wherein the second alignment member is provided at a position away from an inspecting assembly for contacting the pad with the probe, and sending a test signal to a pattern circuit on the substrate to inspect; and the moving distance of the mounting table in said positioning step is long.

4. A method according to claim 1, wherein the first alignment member is mounted on the mounting table, and the first alignment member is moved at least in the X-axis direction together with the mounting table.

5. A substrate inspecting equipment having:

a mounting table on which a substrate having many pads connected to a pattern circuit to be inspected is placed;

an inspecting assembly provided with many probes for contacting with respective pads of the substrate on the mounting table;

an initial setting means for obtaining the positional information of the mounting table on which the substrate is placed and the positional information of at least one of the probes, and previously storing this information as initial setting data;

a first detection means for detecting the position of the at least one of the probes of said inspecting assembly;

a second detection means for detecting the position of the substrate on said mounting table;

a calculation means for calculating the dislocation of the substrate on said mounting table on the basis of the position detected results obtained by the first and second detection means and the initial setting data called from said initial setting means; and a movement means for moving said mounting table to said inspecting section on the basis of said calculated dislocation to contact the pad of the substrate with the at least one of the probes.

6. A substrate inspecting equipment provided with:

a mounting table on which a substrate for liquid crystal display with alignment marks is placed;

an inspecting assembly provided with many probes for contacting with respective pads of the substrate for liquid crystal display on the mounting table;

a detection means for detecting said alignment marks while illuminating a light on the substrate for liquid crystal display on said mounting table; and a means for aligning the substrate with at least one of the probes on the basis of the detected results of said alignment marks, and contacting the pad with the at least one of the probes to test a circuit on the substrate;

said mounting table having a substrate mount surface treated with matting process to reduce a light reflecting coefficient.

7. An equipment according to claim 6, wherein said substrate mount surface is treated with black-color anodized aluminum process.

8. An equipment according to claim 7, wherein said substrate mount surface is provided with:

an evacuating pass communicating with an evacuation means;

a plurality of annular grooves formed on said substrate mount surface and arranged in a manner to be substantially concentric with the outer periphery of the substrate and communicate with the evacuating pass; and a least one communication groove for communicating at least two grooves with each other of the plurality of annular grooves;

said evacuating pass having openings at the communication groove and at least one of said annular grooves.

9. An equipment according to claim 6, wherein said substrate mount surface is provided with:

a central placing member having a first mount surface for supporting the central portion of the substrate;

a peripheral placing member having a second mount surface around the first mount surface both of which are arranged in a manner to be flush with each other, and supporting the periphery of the substrate by the second mount surface; and a means for lowering the peripheral placing member.

10. An equipment according to claim 9, wherein said substrate mount surface is provided with:

an evacuating pass communicating with an evacuation means;

a plurality of annular grooves formed on said substrate mount surface and arranged in a manner to be substantially concentric with the outer periphery of the substrate and communicate with the evacuating pass; and a least one communication groove for communicating at least two grooves with each other of the plurality of annular grooves;

said evacuating pass having openings at the communication groove and at least one of said annular grooves.

11. An equipment according to claim 10, wherein:

said plurality of annular grooves are arranged correspondingly to plural kinds of substrates for liquid crystal display different in area from each other; and there is provided a control means for controlling individually respective means for evacuating passes communicating with respective annular grooves.

12. An equipment according to claim 6, wherein said substrate mount surface is provided with:

an evacuating pass communicating with an evacuation means;

a plurality of annular grooves formed on said substrate mount surface and arranged in a manner to be substantially concentric with the outer periphery of the substrate and communicate with the evacuating pass; and a least one communication groove for communicating at least two grooves with each other of the plurality of annular grooves;

said evacuating pass having openings at the communication groove and at least one of said annular grooves.

* * * * *

UNITED STATES PATENT AND TRADEMARK OFFICE
CERTIFICATE OF CORRECTION

PATENT NO. : 5,742,173
DATED      : April 21, 1998
INVENTOR(S): Yoichi NAKAGOMI, ET AL.

It is certified that error appears in the above-identified patent and that said Letters Patent is hereby corrected as shown below:

On the title page, Item [30] Foreign Application Priority Number 3 date is incorrect.  It should read:

--Mar. 24, 1995  [JP]   Japan............... 7-091766--

Signed and Sealed this

Tenth Day of November 1998

Attest:

*Attesting Officer*

BRUCE LEHMAN

*Commissioner of Patents and Trademarks*